United States Patent
Sogl et al.

(10) Patent No.: US 9,568,521 B2
(45) Date of Patent: *Feb. 14, 2017

(54) DISTORTION ESTIMATION APPARATUS AND METHOD

(71) Applicant: Intel Mobile Communications GmbH, Neubiberg (DE)

(72) Inventors: Bernhard Sogl, Unterhaching (DE); Alexander Belitzer, Munich (DE); Andrea Camuffo, Munich (DE); Jan-Erik Mueller, Ottobrunn (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/677,454

(22) Filed: Apr. 2, 2015

(65) Prior Publication Data

US 2015/0276834 A1 Oct. 1, 2015

Related U.S. Application Data

(63) Continuation of application No. 13/408,551, filed on Feb. 29, 2012, now Pat. No. 9,026,391.

(51) Int. Cl.
*H04L 27/36* (2006.01)
*G01R 23/20* (2006.01)
*G01R 29/26* (2006.01)

(52) U.S. Cl.
CPC .............. *G01R 23/20* (2013.01); *G01R 29/26* (2013.01); *H04L 27/368* (2013.01)

(58) Field of Classification Search
CPC .................................................... H04L 27/368

(Continued)

(56) References Cited

U.S. PATENT DOCUMENTS

| 6,288,610 B1 | 9/2001 | Miyashita |
| 7,248,644 B2 | 7/2007 | Adachi et al. |

(Continued)

FOREIGN PATENT DOCUMENTS

| CA | 2 609 843 C | 11/2006 |
| CN | 101496110 A | 7/2009 |

(Continued)

OTHER PUBLICATIONS

Translation of Chinese Office Action dated Nov. 3, 2014 for copending Chinese Application No. 201310064018.3.

(Continued)

*Primary Examiner* — Bryan Bui
(74) *Attorney, Agent, or Firm* — Eschweiler & Associates, LLC

(57) ABSTRACT

A distortion estimation apparatus for estimating distortion includes a feedback element, a nonlinearity determiner, and a distortion simulator. The feedback element provides a feedback signal derived from a distorted output signal of the distorting element. A signal processing quality of the feedback element is lower than an associated signal property of the distorted output signal. The nonlinearity determiner receives the feedback signal and an input signal to the distorting element or a signal derived from the input signal. The nonlinearity determiner determines an estimated transmission characteristic of the distorting element by relating signal properties of the feedback signal and the input signal or the signal derived from the input signal. The distortion simulator estimates the distortion caused by the distorting element based on the input signal or the signal derived from the input signal and the estimated transmission characteristic.

20 Claims, 20 Drawing Sheets

(58) Field of Classification Search
USPC .......................................................... 702/69
See application file for complete search history.

(56) References Cited

U.S. PATENT DOCUMENTS

| | | | |
|---|---|---|---|
| 8,014,738 | B2 | 9/2011 | Camuffo et al. |
| 8,023,588 | B1 | 9/2011 | Benson et al. |
| 2004/0105510 | A1 | 6/2004 | Tomerlin et al. |
| 2005/0227654 | A1 | 10/2005 | Lin |
| 2007/0190952 | A1 | 8/2007 | Waheed et al. |
| 2008/0074209 | A1 | 3/2008 | Ceylan et al. |
| 2009/0138226 | A1 | 5/2009 | Raghavan et al. |
| 2009/0256630 | A1 | 10/2009 | Brobston |
| 2010/0237948 | A1 | 9/2010 | Nguyen et al. |
| 2011/0025414 | A1 | 2/2011 | Wolf et al. |
| 2011/0033057 | A1 | 2/2011 | Gallo |
| 2011/0064171 | A1* | 3/2011 | Huang .................. H03F 1/3247 375/346 |
| 2011/0187455 | A1 | 8/2011 | Sun et al. |
| 2011/0304390 | A1 | 12/2011 | Huang |
| 2012/0002752 | A1 | 1/2012 | Coan et al. |

FOREIGN PATENT DOCUMENTS

| | | |
|---|---|---|
| CN | 101520666 A | 9/2009 |
| CN | 101595736 A | 12/2009 |
| GB | 2 394 374 A | 4/2004 |
| JP | 2011188093 A | 9/2011 |
| WO | 2006102278 A1 | 9/2006 |
| WO | 2008114346 A1 | 9/2008 |

OTHER PUBLICATIONS

Non-Final Office Action dated Aug. 20, 2014 for U.S. Appl. No. 13/408,551.

Notice of Allowance dated Jan. 13, 2015 for U.S. Appl. No. 13/408,551.

Translation of German Office Action dated May 7, 2015 for copending German Application No. 10 2013 203 272.2.

* cited by examiner

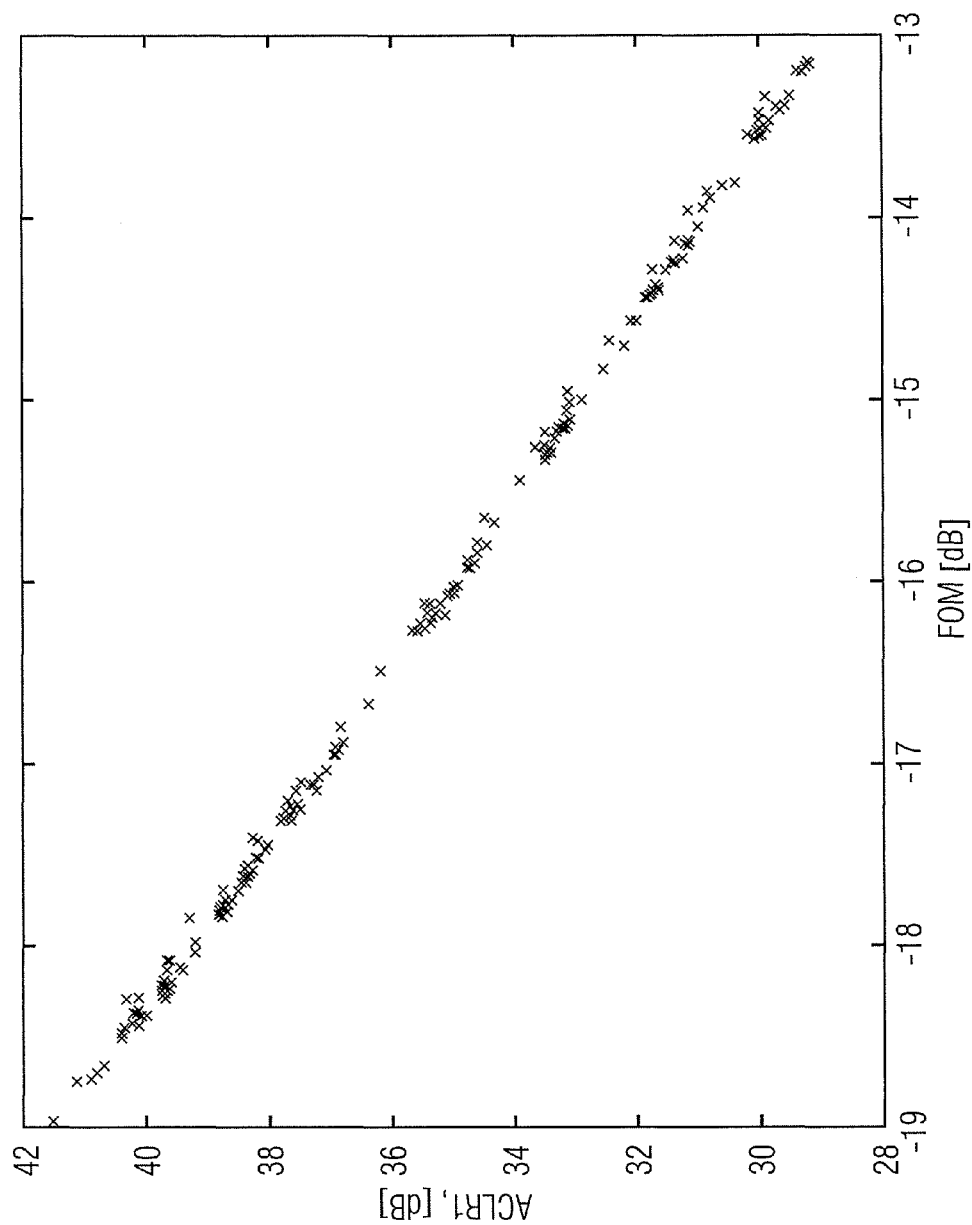

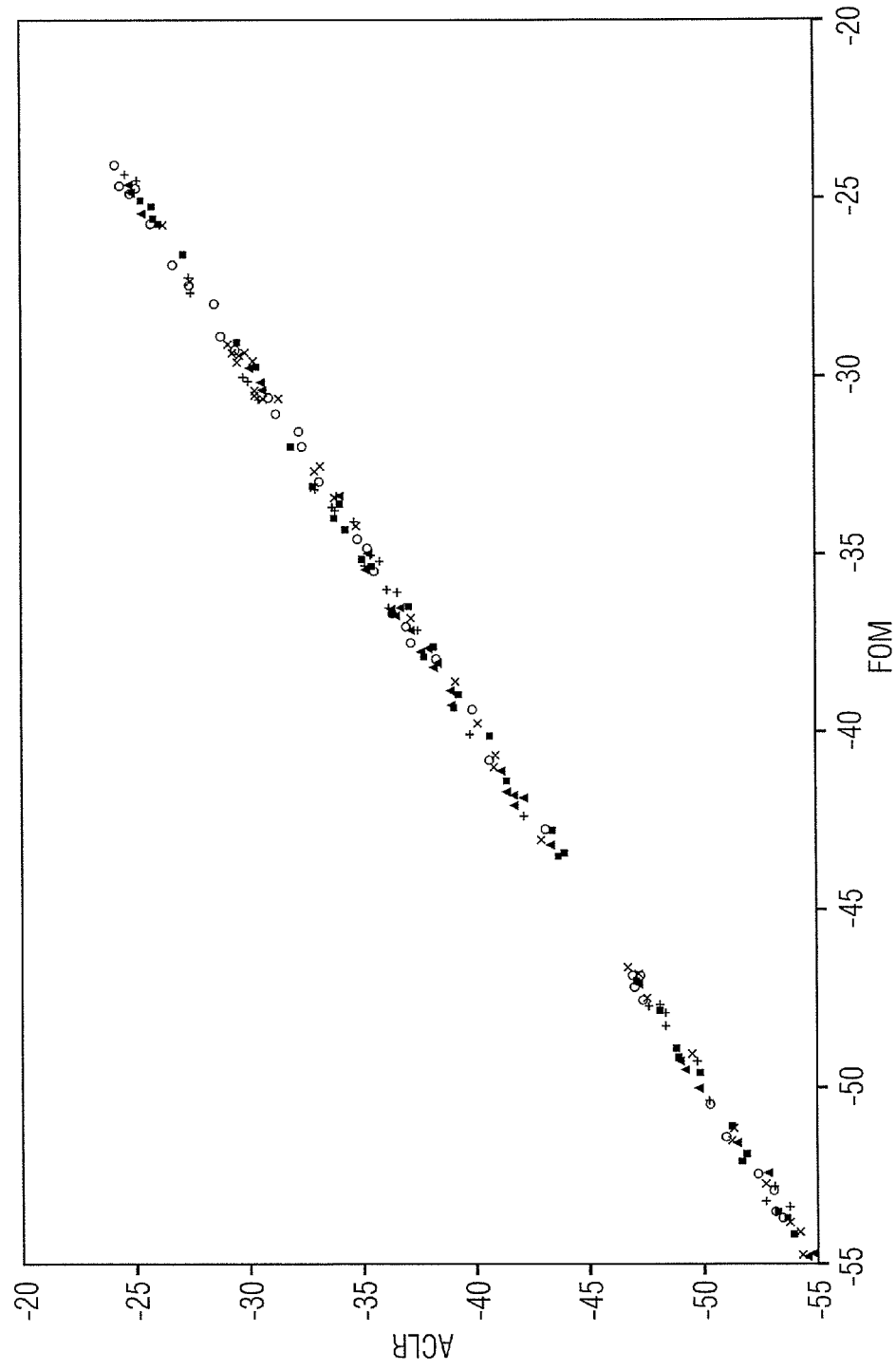

DISTORTION ESTIMATION APPARATUS AND METHOD

REFERENCE TO RELATED APPLICATION

This application is a continuation of U.S. application Ser. No. 13/408,551 filed on Feb. 29, 2012.

FIELD

Embodiments of the present invention relate to a distortion estimation apparatus for estimating a distortion caused by a distorting element. Further embodiments of the present invention relate to a mobile communication device. Further embodiments of the present invention relate to a method for estimating a distortion caused by a distorting element.

BACKGROUND

In modern radio frequency (RF) transceiver systems, the reduction of current consumption is one of the main design targets. The main sink of current in the transceiver chain is still the power amplifier (PA), where much effort is spent in hardware design to achieve an acceptable compromise between current consumption and linearity over many (environmental) conditions, e.g. temperature, frequency, voltage standing wave ratio (VSWR), etc.

To further reduce the power amplifier's current consumption, adaptive (software) algorithms may be used, which can overcome certain hurdles in hardware design. Examples for these algorithms are digital predistortion to increase the linear output power range or bias point adjustment to adapt the linearity according to the specification.

A target for such algorithms is to bring the linearity of the PA as far as possible to the specification limit, and thus save current consumption.

Therefore, in an RF transceiver the measurement of linearity or signal distortion (as specified in the communication standard) is one of the major requirements to be successful with adaptive algorithms.

SUMMARY

Embodiments provide a distortion estimation apparatus for estimating a distortion caused by a distorting element. The distortion estimation apparatus comprises a feedback element, a nonlinearity determiner, and a distortion simulator. The feedback element is configured to provide a feedback signal derived from a distorted output signal of the distorting element. A signal processing quality of the feedback element is lower than an associated signal property of the distorted output signal. The nonlinearity determiner is configured to receive the feedback signal and an input signal to the distorting element or a signal derived from the input signal. The nonlinearity determiner is further configured to determine an estimated transmission characteristic of the distorting element by relating signal properties of the feedback signal and the input signal or the signal derived from the input signal. The distortion simulator is configured to estimate the distortion caused by the distorting element based on the input signal or the signal derived from the input signal and the estimated transmission characteristic.

Further embodiments provide a distortion estimation apparatus configured to estimate a distortion of a distorting element. The distortion estimation apparatus comprises a sensor configured to sense an operating condition of the distorting element to provide an operating condition measurement. The distortion estimation apparatus further comprises a transmission characteristic determiner configured to determine a current transmission characteristic of the distorting element based on the operating condition measurement and a predetermined relation between the operating condition and the transmission characteristic. The distortion estimation apparatus further comprises a distortion simulator configured to estimate the distortion caused by the distorting element based on the estimated transmission characteristic and an input signal to the distorting element or a signal derived from the input signal.

According to further embodiments, a distortion estimation apparatus for estimating a distortion caused by a distorting element comprises means for providing a feedback signal, means for determining an estimated transmission characteristic, and means for estimating the distortion. The feedback signal is derived from a distorted output signal of the distorting element. A signal processing quality of the feedback signal is lower than an associated signal property of the distorted output signal. The means for determining an estimated transmission characteristic of the distorting element is configured to relate signal properties of the feedback signal and an input signal to the distorting element or a signal derived from the input signal. The means for estimating the distortion caused by the distorting element is configured to perform the estimation based on the input signal or the signal derived from the input signal and the estimated transmission characteristic.

Further embodiments provide a mobile communication device comprising a base band processor, an antenna, a transmit chain coupled between the base band processor and the antenna, the transmit chain comprising at least one distorting element, and a distortion estimation apparatus. The distortion estimation apparatus is configured to estimate a distortion caused by the at least one distorting element and comprises a feedback element, a nonlinearity determiner, and a distortion simulator. The feedback element is configured to provide a feedback signal derived from a distorted output signal of the distorting element. A signal processing quality of the feedback element is lower than an associated signal processing property of the distorted output signal. The nonlinearity determiner is configured to receive the feedback signal and an input signal to the distorting element or a signal derived from the input signal. The nonlinearity determiner is further configured to determine an estimated transmission characteristic of the distorting element by relating signal properties of the feedback signal and the input signal to the distorting element or the signal derived from the input signal. The distortion simulator is configured to estimate the distortion caused by the distorting element based on the input signal or a signal derived from the input signal and the estimated transmission characteristic.

Further embodiments provide a method for estimating a distortion caused by a distorting element. The method comprises generating a feedback signal derived from a distorted output signal of the distorting element, wherein a signal processing quality of the feedback signal is lower than an associated signal property of the distorted output signal, and receiving an input signal to the distorting element or a signal derived from the input signal. The method further comprises determining an estimated transmission characteristic of the distorting element by relating signal properties of the feedback signal and the input signal or the signal derived from the input signal, and estimating the distortion caused by the distorting element based on the estimated transmission characteristic and the input signal or a signal derived from the input signal.

According to further embodiments a method for estimating a distortion of a distorting element comprises sensing an operating condition of the distorting element to provide an operating condition measurement, and determining a current transmission characteristic of the distorting element based on the operating condition measurement and a predetermined relation between the operating condition and the transmission characteristic. The method further comprises estimating the distortion caused by the distortion simulator based on the estimated transmission characteristic and an input signal to the distorting element or a signal derived from the input signal.

BRIEF DESCRIPTION OF THE FIGURES

Embodiments will be described using the accompanying figures, in which:

FIG. 13 illustrates a simulation result of an ACLR measurement performed using the distortion estimation apparatus shown in FIG. 11;

FIG. 15C schematically illustrates the ACLR at the output of the distorting element as a function of the figure of merit FOM;

DETAILED DESCRIPTION

Figure 1:
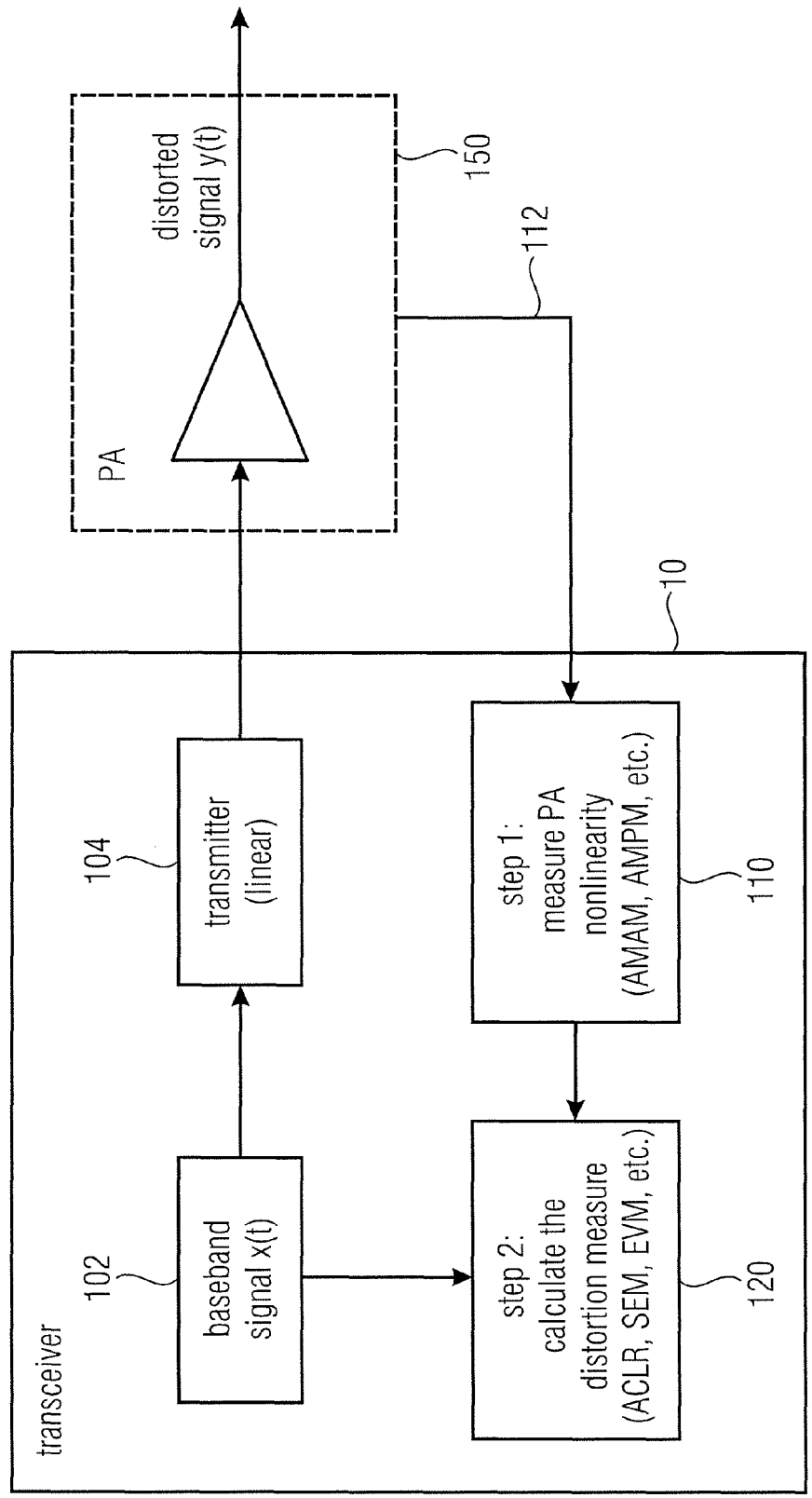
FIG. 1 shows a schematic block diagram of a distortion estimation apparatus according to embodiments.

Before in the following embodiments of the present invention will be described in detail using the accompanying figures, it is to be pointed out that the same elements or elements having the same functionality are provided with the same or similar reference numbers and that a repeated description of elements provided with the same or similar reference numbers is typically omitted. Hence, descriptions provided for elements having the same or similar reference numbers are mutually exchangeable. In the following description, a plurality of details are set forth to provide a more thorough explanation of embodiments of the present invention. However, it will be apparent to one skilled in the art that embodiments of the present invention will be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Amplifiers may have a linear range and a nonlinear range. To avoid signal distortion, amplifiers may be used in their linear range. In the nonlinear range, the signals may be subject to amplitude to amplitude modulation and amplitude to phase modulation. This may be caused by the fact that as the amplifier is operated in the nonlinear range, the ratio of input to output power may not be constant. As the input signal amplitude increases, a disproportionate increase in the output power may be manifested. This may be referred to as amplitude modulation to amplitude modulation (AMAM) since an unwanted additional amplitude modulation is experienced. AMAM may be experienced up to a maximum output power at which point the input values may have the same output value. This may be called compression and may result in the signal being clipped. The signal may have square or sharp edges in the time domain which implies that higher frequency components may be generated. This may cause out of band emissions in addition to distortion of the amplified signal.

In addition to the amplitude distortion discussed above, the output phase of the signal may not be constant at different levels of the amplitudes of the input signal that is being amplified. The amplified signal may experience a phase modulation as a function of the input amplitude and this relationship may not be constant (i.e., the relationship is nonlinear). This may be referred to as amplitude modulation to phase modulation (AMPM).

On the other hand, operating a power amplifier in the linear range may result in a relatively high current consumption and hence relatively poor efficiency. With a view to reducing the current consumption it is desirable to bring the linearity of the power amplifier as far as possible to the specification limit, and thus save current consumption. To this end, adaptive (software) algorithms may be used.

The measurement of linearity or signal distortion is one of the requirements to be successful with adaptive algorithms. The distortion has to be measured with sufficient accuracy at the output of the PA, which would result in a need for an additional receive chain for a transmit band of the transceiver for a number of transceiver structures. This would lead to increased cost, complexity and/or power consumption of the transceiver. Some transceivers developed by the assignee feature a simplified receiver, which is used to detect the output power of the PA for closed loop power control. As the purpose is power control, the dynamic range is limited (mainly by noise) to about 30 dB, which is the closed loop operation power range. However, a measurement of distortion parameters requires a receiver with higher dynamic range (36 dB and more). Embodiments solve the problem of measuring distortion parameters, despite using the implemented feedback receiver (FBR) with insufficient dynamic range or, more generally, with relatively low signal processing quality compared to (an) associated signal property/properties of the distorted output signal.

The specification of today's communication standards distinguishes different parameters for the measurement of distortion. These include a definition of so called in-band distortion parameters (important for a good signal quality in the receiver) and definition of out-of-band distortion parameters (important for low disturbance of neighbor channels, hence low distortion for other users). For example, the Error Vector Magnitude (EVM) describes the in-band distortion, while Adjacent Channel Leakage Ratio (ACLR) and Spectrum Emission Mask (SEM) describe the out-of-band distortion. The definition and measurement instructions can be found in 3GPP specifications.

Today the problem of measuring distortion is solved by making some assumptions on the type of nonlinearity and the property of the signal:

First it is assumed, that the out-of-band distortion limits the overall distortion. As long as this is fulfilled, also the in-band distortion is within the specification limit.

Second, the nonlinearity is dominated by AMAM, hence the AMPM distortion and memory effects must be negligible, which is not always the case (e.g. CMOS PA).

Third, the signal has to fulfill certain properties, hence, not every signal can be used. Currently only "voice" signals are allowed.

With these assumptions, it is possible to use simple measures to derive the ACLR performance, where the signal processing quality (e.g., the dynamic range) of the FBR is sufficient.

A drawback of this implementation is its limitation to one distortion parameter, one communication standard and one type of PA, due to the assumptions made.

Embodiments enable an estimation of distortions by splitting up the distortion measurement into two parts, where each part can be processed with sufficient accuracy.

1) The measurement of PA nonlinearity parameters, which are responsible for the distortion of the signal.

2) Calculation of the distortion measure by using the result of 1) and the undistorted signal.

FIG. 1 shows a schematic block diagram of a distortion estimation apparatus according to embodiments, in combination with a transceiver 10 and a power amplifier 150. In particular, FIG. 1 illustrates the two steps or parts of the measurement of distortion parameters.

The transceiver 10 comprises a baseband processor 102 that is configured to provide a baseband signal x(t). The transceiver 10 further comprises a transmitter 104 configured to process the baseband signal x(t). For example, the transmitter 104 may, for example, frequency-convert the baseband signal x(t) to a radio frequency (RF) range and/or modulate the baseband signal x(t) to provide a driving signal for the power amplifier 150. The transmitter 104 may, in some embodiments, also perform a digital-to-analog conversion of the baseband signal x(t) or a frequency converted version of the base band signal x(t). The transmitter is assumed to be substantially linear in the embodiment shown in FIG. 1, but may in general also exhibit a nonlinear behavior in which case the combined nonlinear behavior of the transmitter 104 and the distorting element 150 may be estimated by the distortion estimation apparatus.

Typically, for power efficiency reasons, the power amplifier 150 may be operated in a non-linear operating range. Hence, the power amplifier 150 typically provides a distorted signal y(t) at its output when amplifying the driving signal. The distorted signal y(t) may then be provided, for example, to a band-pass filter (not shown) and an antenna (not shown), in order to be transmitted. As mentioned above, most radio communication standards allow for a limited degree of distortion within the transmitted signal. As the non-linearity of the power amplifier is one of the causes of the distortion of the transmitted signal, the tolerance range allowed for by the various radio communications standards may be exploited if a momentary degree of distortion of the transmitted signal can be relatively reliably determined. Thus, the power amplifier 150 may be operated deliberately in an operating mode that causes distortions within the output signal of the power amplifier 150 (i.e., within the distorted signal y(t)), yet only to a degree that is still within the limits defined by the communication standard that is currently used. The power amplifier corresponds to a distorting element. In general, the distorting element could be another component exhibiting nonlinear behavior other than a power amplifier, such as a transmission line, a saturated inductance, a saturated capacitor, etc.

The momentary degree or amount of distortion of the transmitted signal can be determined, measured, or at least estimated by means of a distortion estimation apparatus according to embodiments. The distortion estimation apparatus comprises a feedback element 112, a nonlinearity determiner 110, and a distortion simulator 120. The feedback element 112 is a feedback loop in the embodiment of FIG. 1 that is configured to feed back a feedback signal from the power amplifier 150 to the nonlinearity determiner 110 of the distortion estimation apparatus. The feedback signal may be a signal derived from or similar to the distorted signal y(t). Alternatively, the feedback signal may be a measurement signal indicative of an operating condition of the power amplifier 150, such as a temperature, a power consumption, a duty cycle, etc. The feedback element 112 may correspond to a more complex structure comprising one or more signal processing elements, such as analog and/or digital signal processing circuits. The feedback element 112 typically has a signal processing quality (signal processing performance) that is lower than an associated signal property of the distorted output signal. In other words, the signal processing quality of the feedback element may not be as high as would normally be required to process the distorted output signal without losing information. As an example, the feedback element 112 may have a smaller dynamic range than a dynamic range of the distorted output signal. Nevertheless, the nonlinearity of the distorting element 150 may typically be determined with sufficient precision because the nonlinearity is typically most noticeable in a certain amplitude range of the distorted signal y(t), for example an amplitude range of relatively high amplitudes. Therefore, by adjusting the dynamic range of the feedback element 112 so that it corresponds to said amplitude range (e.g., a range of relatively large amplitudes), the feedback signal may contain relevant information about the nonlinearity of the distorting element 150. As an alternative to the dynamic range, the signal processing quality of the feedback element 112 may refer to a sampling rate of the feedback signal in case the feedback element 112 performs an analog-to-digital conversion. Again, even though the sampling rate may be lower than would normally be required to correctly represent the distorted output signal, due to the Nyquist-Shannon sampling theorem, the resulting signal may contain sufficient information for the purpose of distortion estimation. Besides the dynamic range and the sample rate, other signal processing qualities and/or signal properties may be considered. The various signal processing qualities of the feedback element 112 and the associated signal properties of the distorted output signal may be considered individually or in any combination. Hence, the performance of the feedback element 112 may be relatively low (compared to the associated signal property of the distorted signal) so that a quality of the feedback signal is not as high as that of the distorted output signal. In embodiments, the feedback element 112 may be regarded as a relatively low-fidelity component in comparison to the distorting element. According to some embodiments, the feedback element 112 may have a dynamic range and/or a frequency range that is smaller than (or lower than, or reduced with respect to) a dynamic range and/or a frequency range of the distorted signal, respectively.

The nonlinearity determiner 110 is configured to perform a first step of estimating the momentary degree or amount of distortion of the distorted signal y(t). The first step may comprise measuring a power amplifier nonlinearity, such as an AMAM nonlinearity, a AMPM nonlinearity, or other types of nonlinearity. The nonlinearity determiner 110 receives the feedback signal via the feedback element 112. Various options for determining or estimating the nonlinearity of the distorting element (here: the power amplifier 150) are possible and will be explained in more detail below.

The distortion simulator 120 is configured to perform a second step of estimating the momentary degree or amount of distortion of the distorted signal y(t), namely to calculate the distortion measure. The distortion measure may be, for example, the error vector magnitude (EVM), the adjacent channel leakage ratio (ACLR), the spectrum emission mask (SEM), and/or further distortion measures. The distortion simulator 120 is configured to receive the baseband signal x(t) from the baseband processor 102 and, from the nonlinearity determiner 110, a determined or estimated information about the nonlinearity of the distorting element 150. The distortion simulator may be configured to simulate how the distorting element distorts the baseband signal so that the distortion measure may be determined based on such a simulation.

The measurement can be realized to work during transmission without influence on the sent signal. It may be necessary to measure or estimate the PA nonlinearity parameters with sufficient accuracy. The main PA nonlinearity parameters are AMAM distortion, AMPM distortion and memory effects. For very low signal amplitudes the PA is usually highly linear and the signal is undistorted. For high signal amplitudes the PA is nonlinear and changes the signal. Therefore the nonlinearity of the PA can be measured at large signal amplitudes, where noise is negligible. This shows, that the PA nonlinearity parameters can be measured, even in the case of low signal to noise ratio after the feedback receiver, because only large signal components are used for measurement.

Embodiments demonstrate how the distortion parameters can be measured in case a detector or a relatively simple feedback receiver is used, which has a relatively high noise figure and/or relatively narrow dynamic range, i.e., a relatively low signal processing quality compared to the associated signal property (dynamic range) of the distorted output signal. The distortion parameters are determined indirectly in one embodiment, by first measuring the nonlinearity characteristic of the PA and then distorting the undistorted input signal. The resulting signal is then used to calculate the distortion parameter of interest.

Following, the two parts of the procedure are described in more detail, also showing possible alternative implementations.

Step 1)—measurement of the PA's nonlinearity: Three alternatives 1A, 1B, and 1C are presented. According to the first alternative 1A the distorted signal y(t) is tapped and processed (e.g., frequency downconversion, analog-to-digital conversion, etc.) and a corresponding feedback signal is compared with the baseband signal to determine how the distorted signal y(t) differs from the baseband signal x(t). As a result of such a comparison the nonlinearity of the distorting element 150 can be determined. The second alternative 1B is based on a predetermined relation between an operating condition (e.g., temperature, frequency, voltage standing wave ratio) and the nonlinearity so that only the current operating condition(s) need to be measured in order to determine an estimation of the nonlinearity of the distorting element 150. The third alternative 1C corresponds to a combination of the first and second alternatives 1A and 1B.

Figure 2:
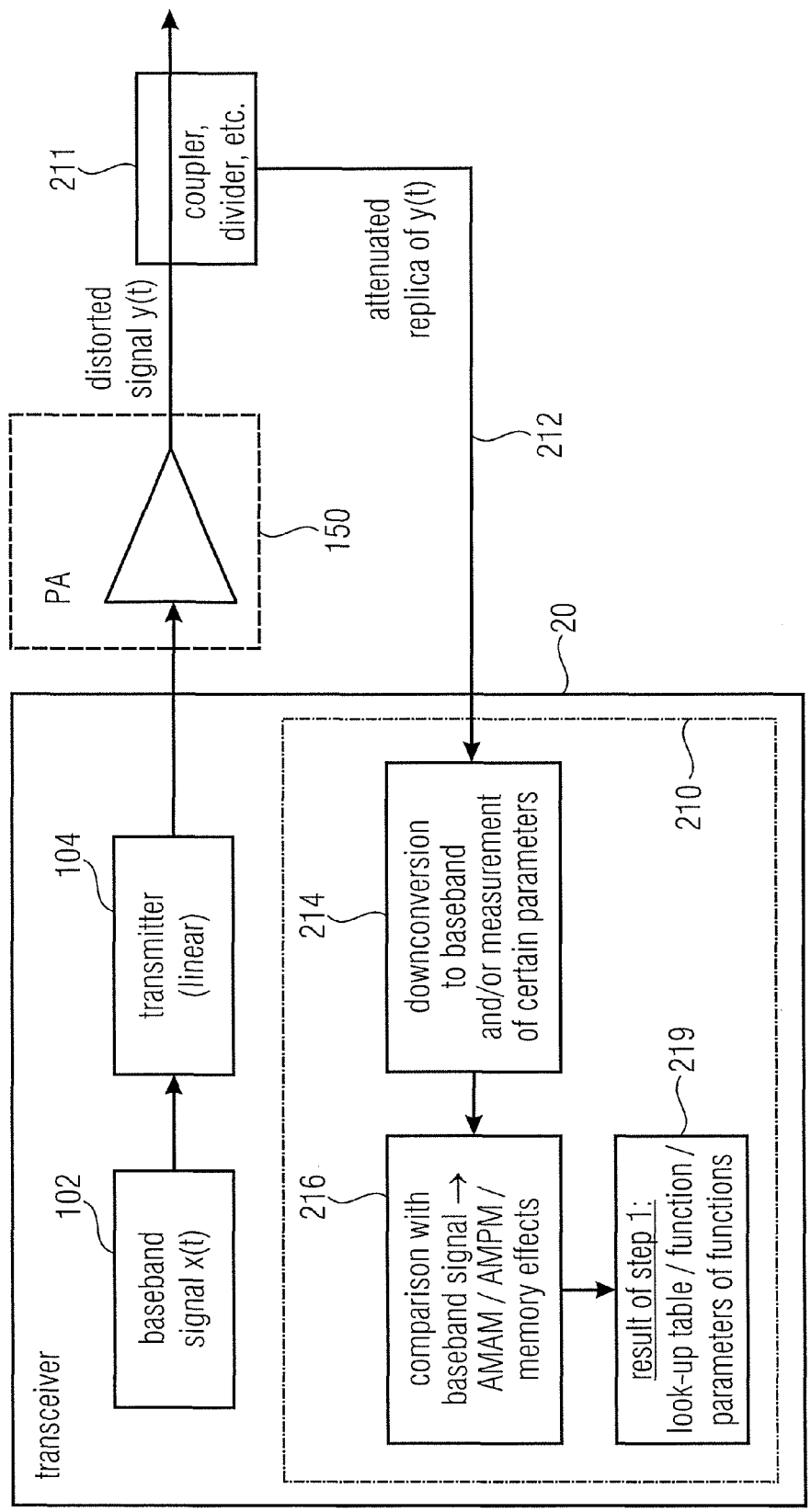
FIG. 2 shows a schematic block diagram of a first alternative for a measurement of a nonlinearity.

The first alternative 1A for the first step (measurement of nonlinearity) of the distortion estimation is illustrated in FIG. 2: Briefly, the first alternative comprises:

1A.1) An attenuated replica of the signal y(t) at the output of the PA 150 is generated, without influence on the transmission. This can be done with a coupler or divider 211 or any other active or passive component.

1A.2) Conversion of the signal y(t) for the next step. This is in most cases involves a down-conversion of the signal to the baseband. Alternatively, only some significant parameters of the signal could be extracted for further processing, like peak power, rms power, phase, etc.

1A.3) Comparison with the undistorted signal x(t) and measurement of AMAM/AMPM/memory effects, either individually or in any combination. The results can be stored as look-up-tables, functions (polynomials) or parameters of functions, like polynomial coefficients.

The transceiver 20 comprises the baseband processor 102 and the transmitter 104. The distorted signal y(t) is tapped at the output of the power amplifier 150 by a coupler or divider 211. As the coupler or divider 211 typically only extracts a small portion of the distorted signal y(t), the distorted signal y(t) is substantially unaltered by the action of the coupler/divider 211. The coupler/divider 211 provides an attenuated replica of the distorted signal y(t) to the nonlinearity determiner 210. The nonlinearity determiner 210 comprises a signal processing block 214 for downconversion to baseband and/or measurement of certain parameters of the attenuated replica of the distorted signal y(t). The nonlinearity determiner 210 further comprises a comparison component 216 configured to receive the downconverted replica of the distorted signal y(t) and the baseband signal x(t). The downconverted replica of the distorted signal y(t) is compared with the baseband signal x(t) to determine the distortion caused by the distorting element 150 for certain input waveforms and/or amplitudes of the baseband signal x(t). In particular, the comparison component 216 may determine AMAM nonlinearities, AMPM nonlinearities, and memory effectrelated nonlinearities. Notwithstanding, other types of distortions are also possible. A result of the comparison of the downconverted replica of the distorted signal y(t) and the baseband signal x(t) may be expressed in the form of a look-up table, a function, parameters of functions, etc. and stored in a memory or storage component 219. For example, a look-up table may contain pairs of amplitudes of the baseband signal x(t) and the distorted signal y(t). An interpolation or an extrapolation may be performed when evaluating the lookup table to determine an amplitude of the distorted signal y(t) that is not contained in the lookup table.

Figure 3:
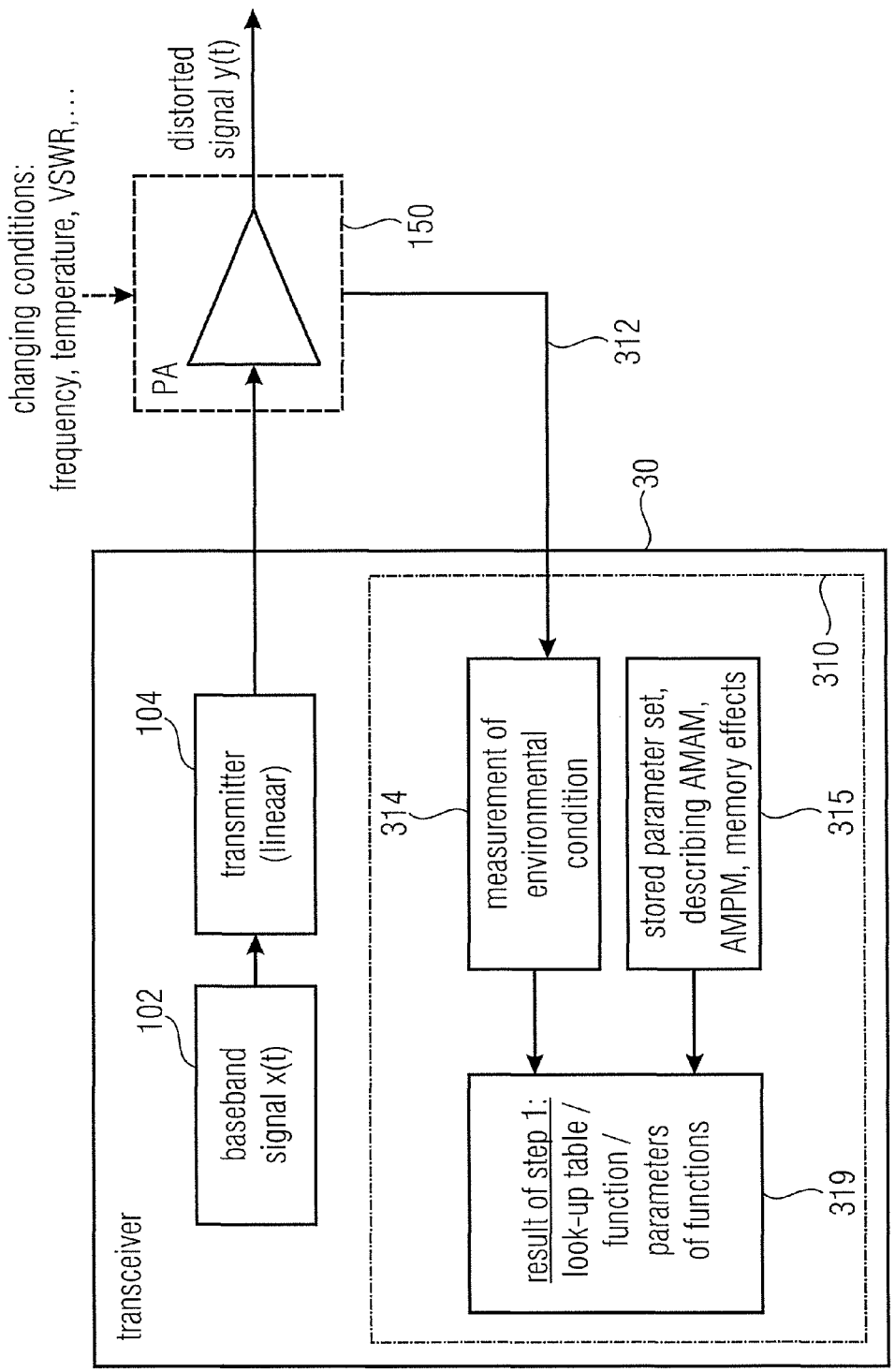
FIG. 3 shows a schematic block diagram of a second alternative for a measurement of a nonlinearity.

The second alternative 1B for the first step (measurement of nonlinearity of distorting element 150) is illustrated in FIG. 3. Briefly, the second alternative comprises:

1B.1) The PA nonlinearity (AMAM, AMPM, etc.) is characterized under different, but known conditions, like temperature, frequency, VSWR, etc. by simulation or measurement.

1B.2) The results are stored in the chip as look-up-table, function or parameters of functions.

1B.3) In the chip only these environmental conditions are measured.

1B.4) The PA nonlinearity is calculated, using the results of 1B.2) and 1B.3).

The feedback element 312 is configured to provide a current value or measurement of an environmental condition and/or an operating condition to the nonlinearity determiner 310. The environmental condition may be, for example a temperature of the distorting element 150. An example for an operating condition may be a frequency of the driving signal of the distorting element 150 or a voltage standing wave ratio (VSWR).

The nonlinearity determiner 310 comprises a measurement component 314 for the environmental condition and/or the operating condition. Furthermore, the nonlinearity determiner 310 comprises a storage component 315 for one or more stored parameter sets describing nonlinearities (AMAM, AMPM, memory effects, etc.) of the distorting element 150 for the different environmental/operating conditions. A component 319 may be configured to receive the measured momentary environmental/operating condition from the measurement component 214 and the stored parameter set(s) from the storage component 315. In this manner, the current nonlinearity behavior of the distorting element 150 for the currently prevailing environmental condition and/or operating condition may be estimated. An interpolation and/or an extrapolation may be performed in case the parameter sets stored in the storage component 315 do not contain an entry for the exact environmental/operating condition measured by the measurement component 314.

Figure 4:
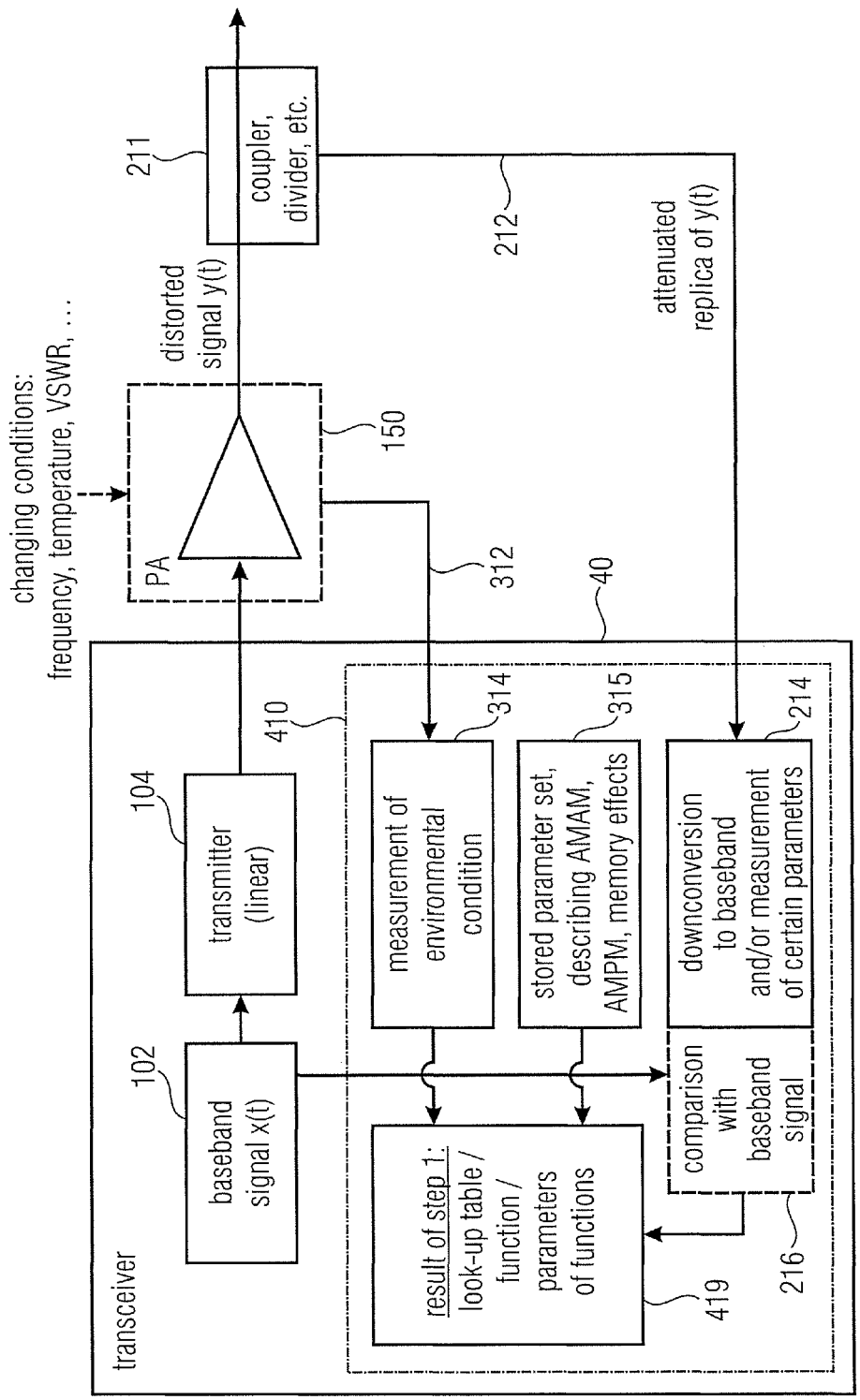
FIG. 4 shows a schematic block diagram of a third alternative for a measurement of a nonlinearity.

A third alternative for the first step is illustrated in FIG. 4 and may be described as a mixture or combination of Alternative 1A and 1B. Briefly, the third alternative comprise:

1C.1) Same as 1B.1) (i.e., characterization of nonlinearity under different, known conditions).

1C.2) Same as 1B.2) (i.e., storing of characterization results on chip).

1C.3) In the chip only few environmental conditions are measured, e.g., frequency and temperature, but not VSWR.

1C.4) The unknown parameters are measured from the signal, as described in 1A.1) and 1A.2).

1C.5) The PA nonlinearity is calculated using the results of 1C.2) and 1C.4).

The nonlinearity determiner 410 comprises the measurement component 314, the storage component 315, the signal processing component 214, the comparison component 216, and the storage component 419 for the determined nonlinearity of the distorting element 150. The feedback element comprises the feedback loop 312 for the environmental/operating condition measurement and also the feedback loop 212 for the attenuated replica of the distorted signal y(t). In particular, in one embodiment the attenuated replica of the distorted signal y(t) may be used for determining the voltage standing wave ratio of the distorted signal y(t).

Figure 5:
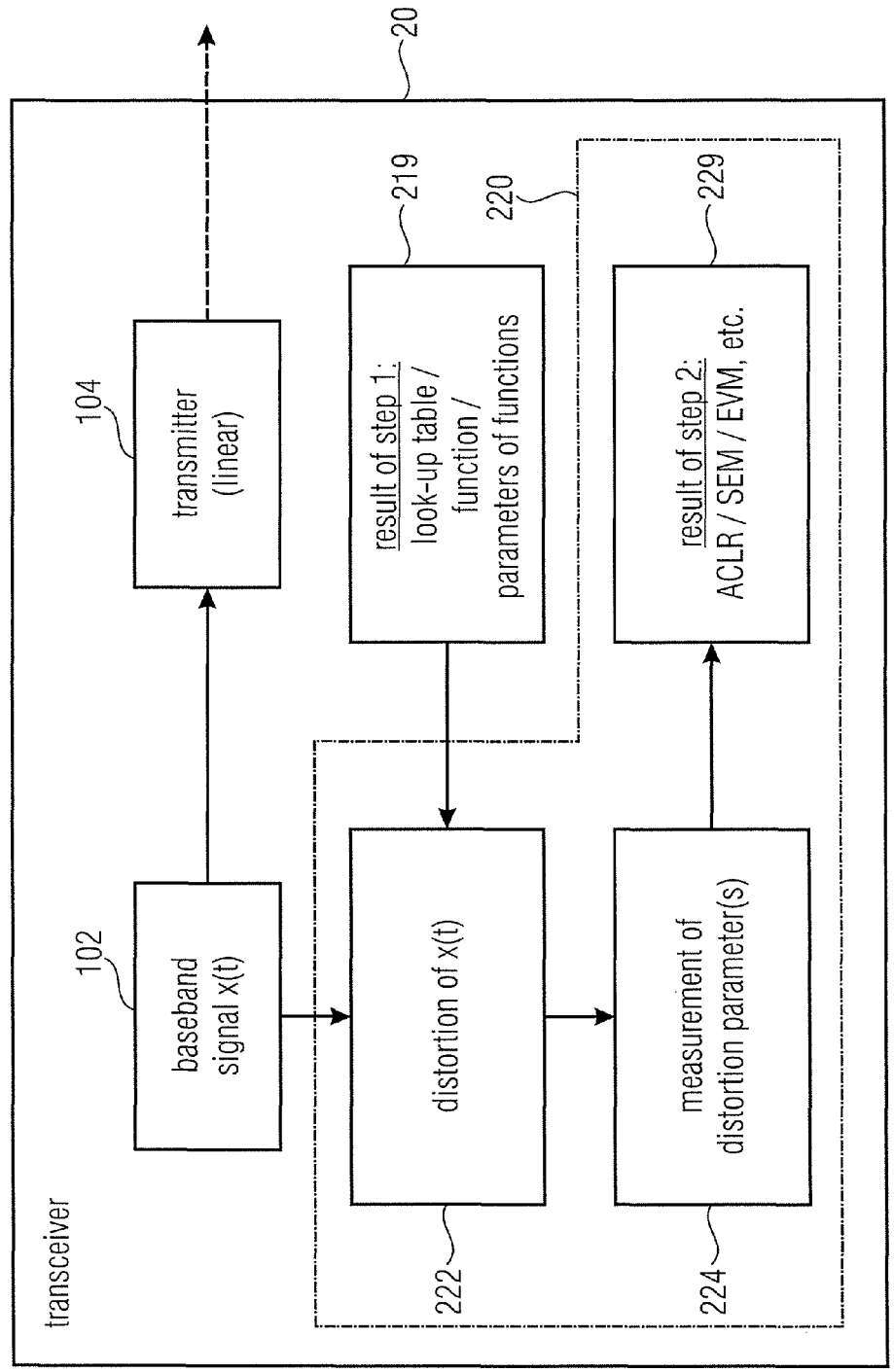
FIG. 5 shows a schematic block diagram of a first alternative for a calculation of a distortion measure.
Figure 6:
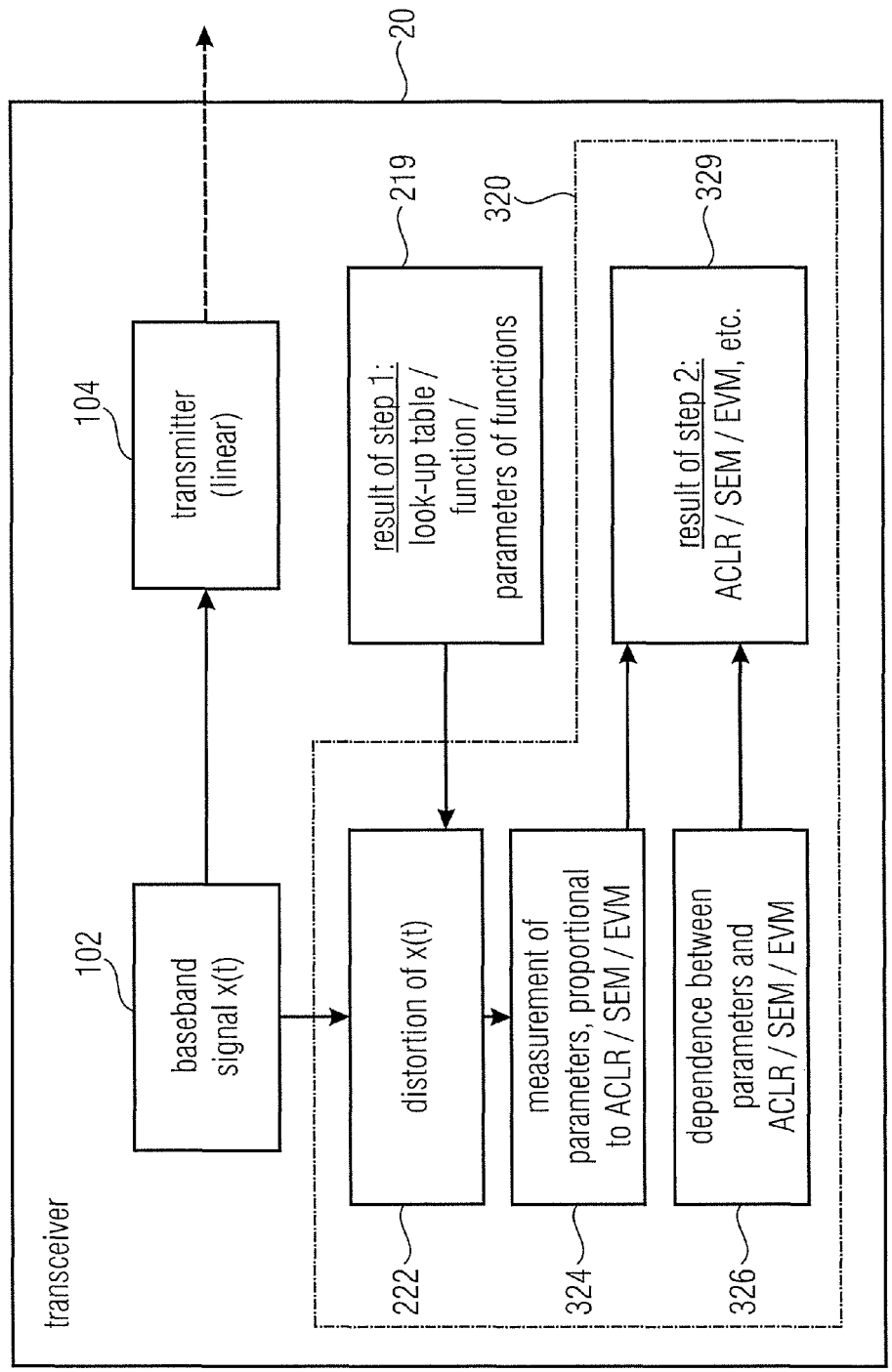
FIG. 6 shows a schematic block diagram of a second alternative for a calculation of a distortion measure.
Figure 7:
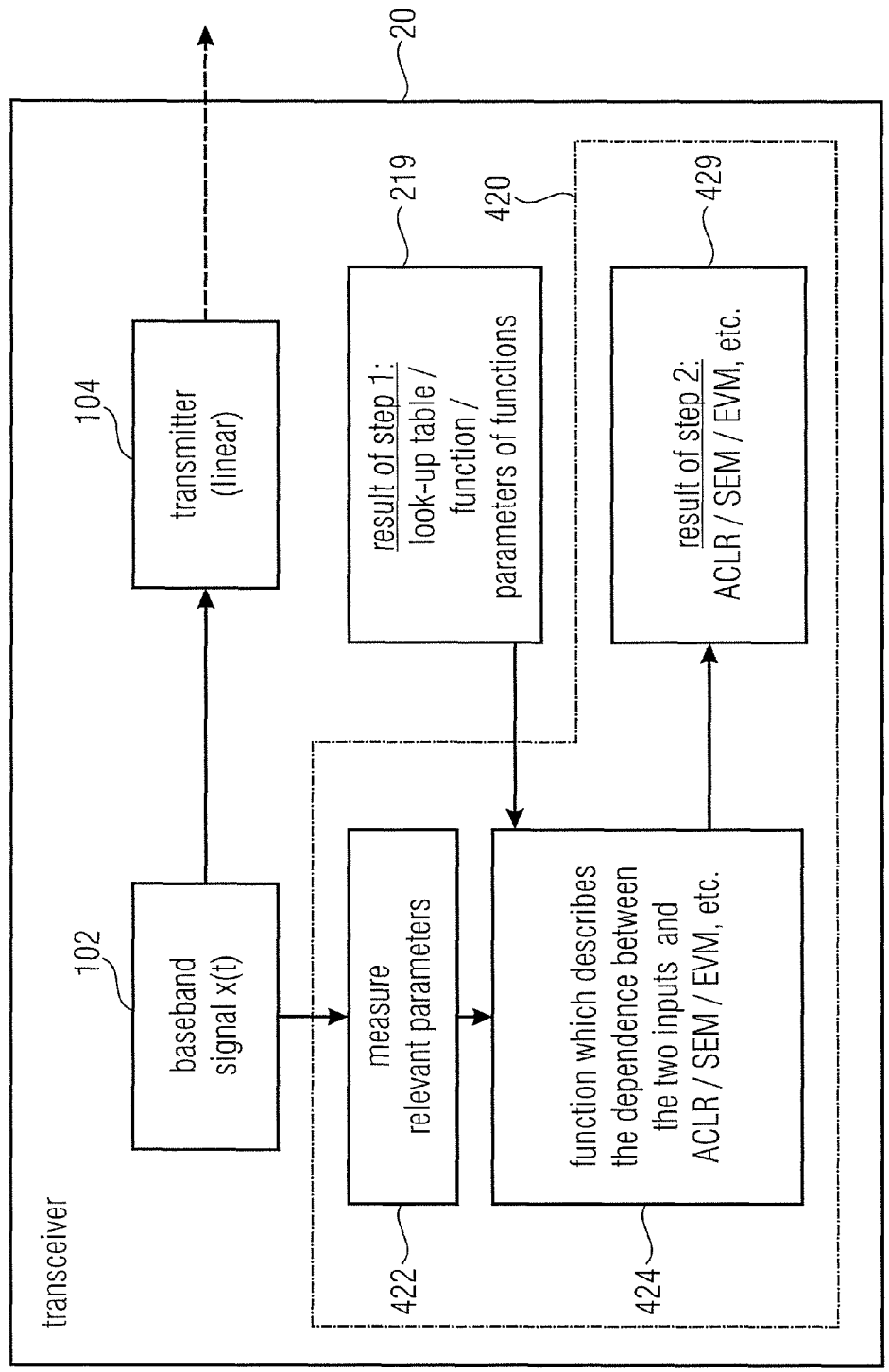
FIG. 7 shows a schematic block diagram of a third alternative for a calculation of a distortion measure.

The second step of the nonlinearity estimation, namely the calculation of the distortion measure, is illustrated in FIGS. 5 to 7. Again, several alternatives exist which are illustrated in FIGS. 5 to 7 and explained in the corresponding description. A first alternative suggests a distortion of the undistorted baseband signal x(t) using the result of the nonlinearity determination of step 1, and a determination of the distortion parameters of the resulting signal that are substantially identical or similar to the distortion parameters of the distorted signal y(t). A second alternative suggests an indirect determination of the distortion parameters where the undistorted baseband signal x(t) is distorted using the result of step 1, as well. Then an intermediate distortion parameter is determined. A further distortion parameter is finally determined using a known relation between the intermediate distortion parameter and the further distortion parameter.

The first alternative for the second step is designated as alternative 2A and illustrated in FIG. 5 which shows a schematic block diagram for measuring the distortion parameter. Briefly, the first alternative for measuring the distortion parameters proposes:

2A.1) The result of Step 1) is used to distort the undistorted baseband signal x(t) (or a signal derived from the baseband signal x(t)). The resulting signal contains nearly the same distortion, as generated by the PA 150. Thus, also a similar signal to noise ratio.

2A.2) The distortion parameter (ACLR/SEM/EVM) is measured, according to the definition.

The distortion estimation apparatus according to the embodiment shown in FIG. 5 comprises a distortion simulator 220 that is configured to receive the baseband signal x(t) and the result of the first step (nonlinearity determination) stored in the storage component 219. The distortion simulator 220 comprises a distortion component 222 configured to distort the baseband signal x(t) based on the nonlinearity parameters provided by the storage component 219. The distortion component 222 generates a distorted version of the baseband signal x(t). The distorted version of the baseband signal x(t) is provided to a measurement component 224 which is configured to measure the distortion parameter(s) of the distorted version of the baseband signal x(t). A result of the measurement performed by the measurement component 224 is stored in a further storage component 229. For example, the measurement component 224 may be configured to determine the ACLR, the SEM, and/or the EVM of the distorted version of the baseband signal x(t). As the distortion component assumes a nonlinearity that at least approximately equals the nonlinearity of the distorting element 150, the distorted version of the baseband signal x(t) typically provides a good estimate of the distortions within the distorted signal y(t). The distortion simulator 220 may be combined with the nonlinearity determiner 310 or 410 shown in FIGS. 3 and 4, or another nonlinearity determiner. Hence, the storage component 219 may be replaced or complemented by the storage component 319 and/or 419. The same holds for the embodiments shown in FIGS. 6 and 7.

The second alternative for the second step of the distortion estimation according to embodiments is illustrated in schematic block diagram form in FIG. 6. Briefly, the second alternative provides for:

2B.1) Same as 2A.1) (i.e., distortion of the baseband signal x(t) using the determined nonlinearity from step 1).

2B.2) One or more parameters are measured, which are proportional to the distortion parameter of interest.

2B.3) The distortion parameter itself is calculated from the result of 2B.2 and a known (e.g. linear, quadratic, . . . ) dependence.

The distortion estimation apparatus 20 shown in FIG. 6 comprises the distortion simulator 320 having a distortion component 222 that is configured to receive the baseband signal x(t) and the result of the first step, i.e., the determination of the linearity of the distorting element 150. The parameters or information describing the nonlinearity of the distorting component 150 are provided by the storage component 219 to component 222. The resulting distorted version of the baseband signal x(t) is provided to a measurement component 324 which is configured to determine parameters that are proportional to the distortion parameter of interest, or related to the distortion parameter of interest by another dependency (e.g. linear, quadratic, logarithmic, exponential, etc.). This dependency between the determined distortion parameter and the distortion parameter of interest is provided by a storage component 326. The distortion parameter(s) of interest may then be determined based on the results provided by the measurement component 324 and the storage component 326, in particular by evaluating the known dependency between the determined distortion parameter and the distortion parameter of interest for the value of the determined distortion parameter.

The third alternative for the second step (i.e., the calculation of the distortion measure) is illustrated in FIG. 7. According to the third alternative no distorted version of the baseband signal x(t) is determined, but intermediate distortion parameters are determined directly based on the baseband signal and the nonlinearity determined during step 1 and stored by the storage component 219, 319, 419. Briefly, the third alternative provides for the following aspects:

2C.1). The undistorted input signal is used to derive parameters, which are relevant for the calculation of the distortion parameter.

2C.2) The result of Step 1) together with the result of 2C.1) are combined, using a known dependence, to calculate the distortion parameter itself.

The distortion simulator 420 comprises a parameter measurement component 422 configured to measure signal parameters of the baseband signal x(t). The measured signal parameters may be relevant to the subsequent determination or estimation of distortion parameters. The measured parameters are used as an input for a function 424 that describes the dependence between the measured parameters and the determined nonlinearity as inputs, and, as output, the distortion parameter(s) of interest, e.g., ACLR, SEM, EVM, etc. The distortion parameter(s) of interest is/are stored in a storage component 429.

For alternatives 2A (FIG. 5) and 2B (FIG. 6) it may be required to have the result of Step 1 available, before the calculation can be started.

For Alternative 2C (FIG. 7) there are two possibilities for the timing:

Timing 1): The procedure 2C.1 is always done, when the result of Step 1 is available.

Timing 2): The procedure 2C.1 is done only, when a trigger event occurs. In all other cases the procedure 2C.2 uses the last results of 2C.1.

The second timing typically provides for a reduced calculation time and also reduced current consumption.

Figure 8:
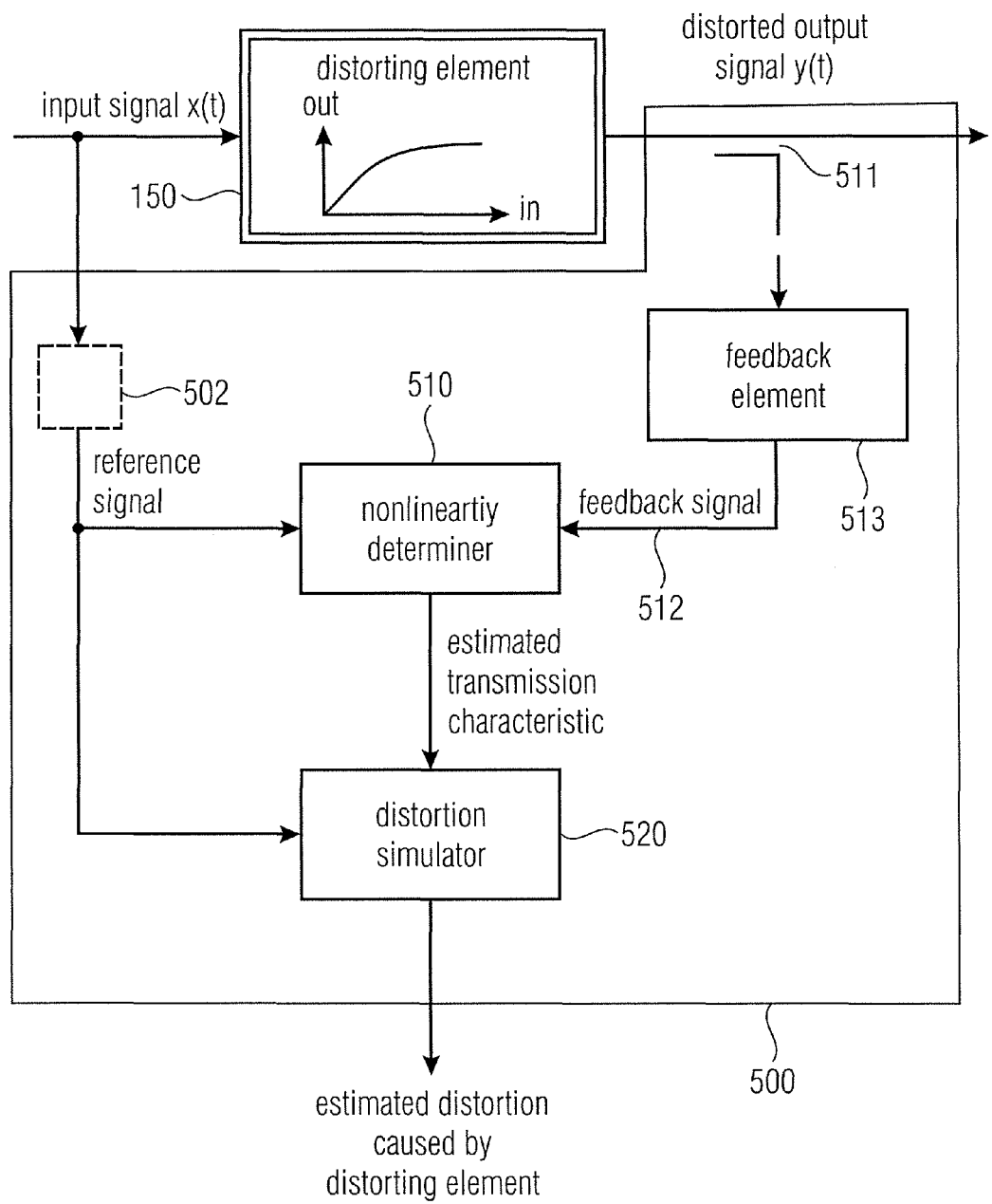
FIG. 8 shows a schematic block diagram of a distortion estimation apparatus according to embodiments.

FIG. 8 shows a schematic block diagram of a distortion estimation apparatus 500 according to embodiments disclosed herein. The distortion estimation apparatus 500 is configured to estimate the momentary distortion of a distorted output signal caused by a distorting element 150, in comparison to an input signal to the distorting element 150. An input-output characteristic of the distorting element 150 exhibiting saturation is schematically indicated as an example (other characteristics are also imaginable). The distortion estimation apparatus 500 is connected or indirectly connected (via a coupler) to an input of the distorting element 150 and to an output of the distorting element 150. In the embodiment of FIG. 8 the input signal is provided to an (optional) input signal processor 502 that is configured to derive a reference signal from the input signal. In some embodiments the input signal processor 502 may be a connection between the input of the distorting element 150 and the nonlinearity determiner 510, i.e., no particular processing is performed on the input signal in order to obtain the reference signal (hence, the reference signal substantially corresponds to the input signal). The reference signal may also be regarded and referred to as a derived signal, at least in some embodiments. Typically, the reference signal is similar to the input signal. The distorted output signal or a replica of the output signal is tapped from the output of the distorting element 150 by means of a coupler/divider 511. A feedback element 513 is connected to the coupler/divider 511. In embodiments the coupler/divider 511 may be a part of the feedback element 513 or the coupler/divider 511 may form the feedback element. At an output of the feedback element 513 a feedback signal 512 is provided to a nonlinearity determiner 510. The feedback signal may be a quality-reduced representation (for example, a dynamic-reduced representation) of the distorted output signal y(t) or a signal parameter of the distorted output signal, such as a crest factor of the distorted output signal y(t). As only a quality-reduced or dynamic-reduced representation of the distorted output signal or the signal parameter(s) need(s) to be fed back to the nonlinearity determiner 510, the feedback element 513 and the feedback loop or connection 512 may have a dynamic range that is smaller than a dynamic range of the distorted signal, i.e., the feedback element 513 may have a signal processing quality that is lower than an associated signal property of the distorted signal. Besides the dynamic range of the feedback element 513 and the distorted signal, other signal processing qualities and signal properties may be used, either individually or in combination.

The nonlinearity determiner 510 is configured to determine an estimated transmission characteristic of the distorting element 150 by comparing the reference signal and the feedback signal. Such a comparison reveals how the distorting element 150 modifies the distorted output signal y(t). The estimated transmission characteristic is provided to a distortion simulator 520. Another input for the distortion simulator 520 is the reference signal. The distortion simulator 520 may now determine how the estimated transmission characteristic of the distorting element 150 modifies the reference signal. Subsequently, the distortion simulator 520 may determine an amount of distortion that is observable in the distorted reference signal.

Figure 9:
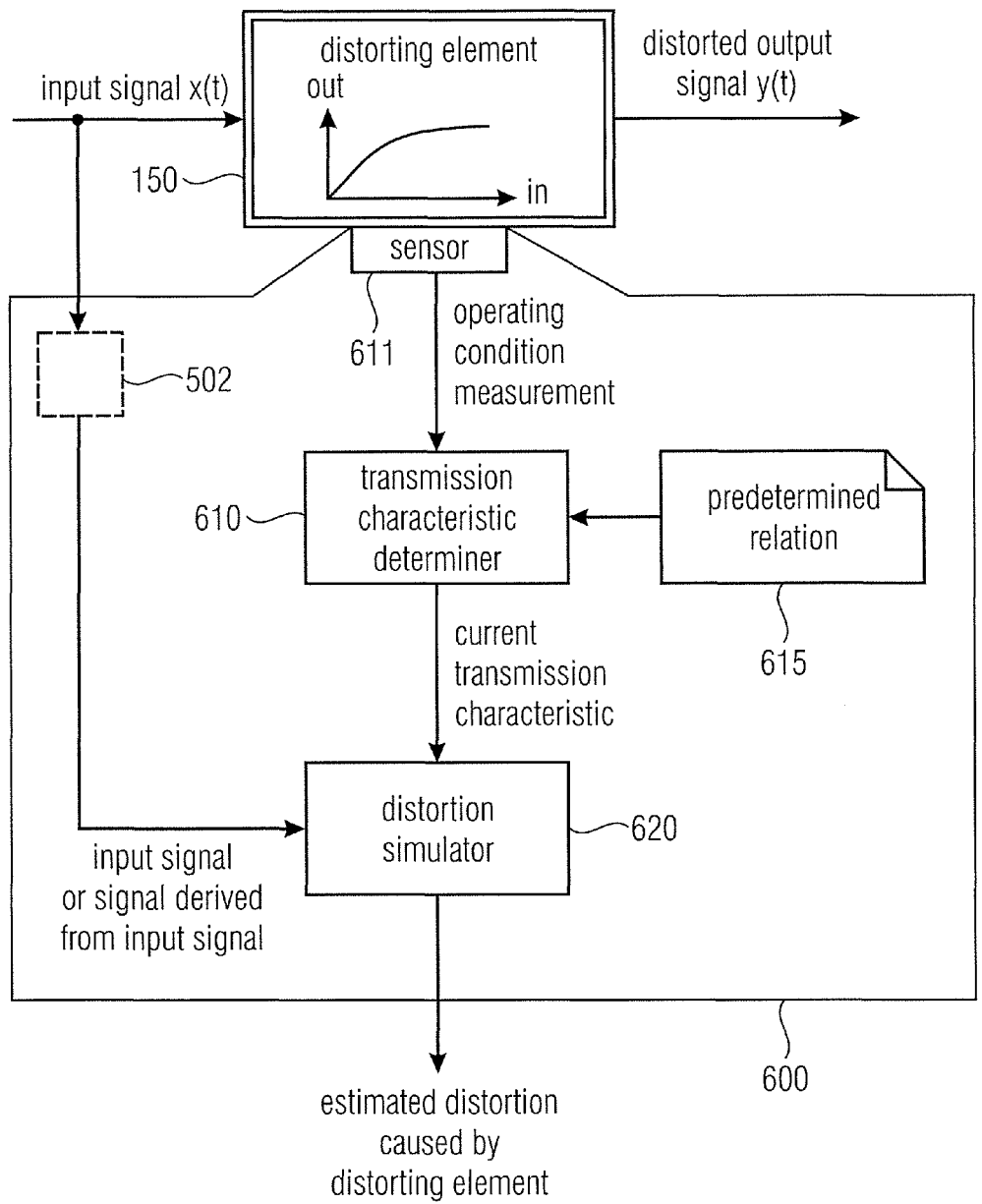
FIG. 9 shows a schematic block diagram of a distortion estimation apparatus according to embodiments.

FIG. 9 shows a schematic block diagram of a distortion estimation apparatus 600 according to embodiments. The distortion estimation apparatus 600 is configured to measure (an) environmental conditions and/or operating condition(s) of the distorting element 150 in order to estimate a current transmission characteristic of the distorting element 150. The distortion estimation apparatus 600 comprises a sensor 611, a transmission characteristic determiner or nonlinearity determiner 610, a storage component 615 for a predetermined relation between environmental/operating condition and transmission characteristic of the distorting element 150, a distortion simulator 620, and an (optional) input signal processor 502. The sensor 611 is configured to measure an environmental/operating condition of the distorting element 150, e.g. temperature, frequency, voltage standing wave ratio, etc. The measured environmental/operating condition is provided to the transmission characteristic determiner 620. Another input for the transmission characteristic determiner 620 is one or more predetermined relations between the measured environmental/operating condition and the transmission characteristic of the distorting element 150. These predetermined relations may have been obtained, for example, by means of a simulation or during a final inspection of the distorting element 150 and then stored in the storage component 615 in a nonvolatile manner or a modifiable manner.

The transmission determiner 610 is configured to determine, at least approximately, a current transmission characteristic of the distorting element 150. The current transmission characteristic is provided to the distortion simulator 620 which uses the current transmission characteristic in conjunction with the input signal to the distorting element 150 or a signal derived from the input signal (using input signal processor 502) to determine an estimated distortion caused distorting element 150.

Figure 10:
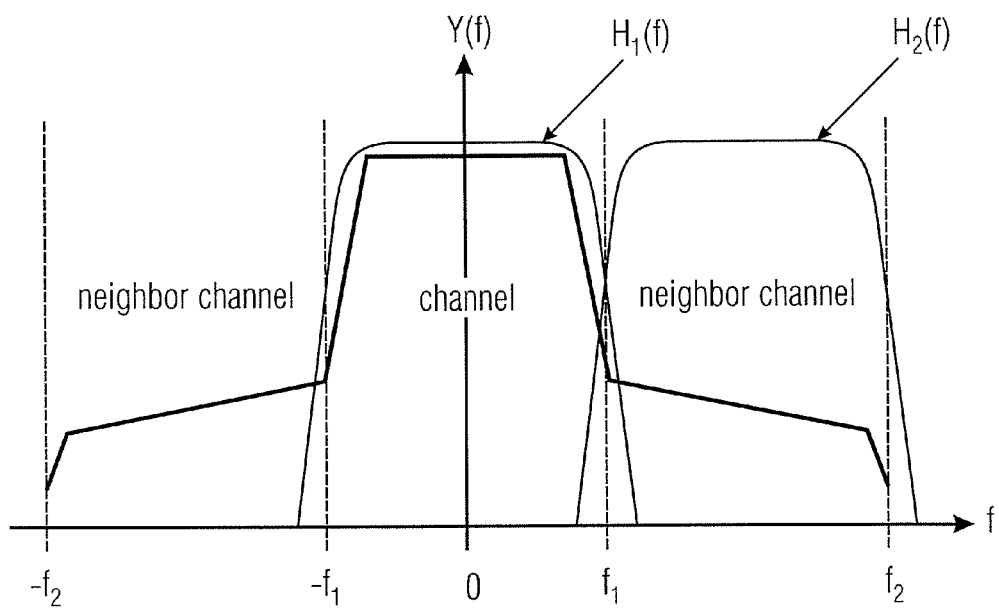
FIG. 10 shows a schematic frequency power spectrum illustrating an adjacent channel leakage ratio (ACLR)
Figure 14A:
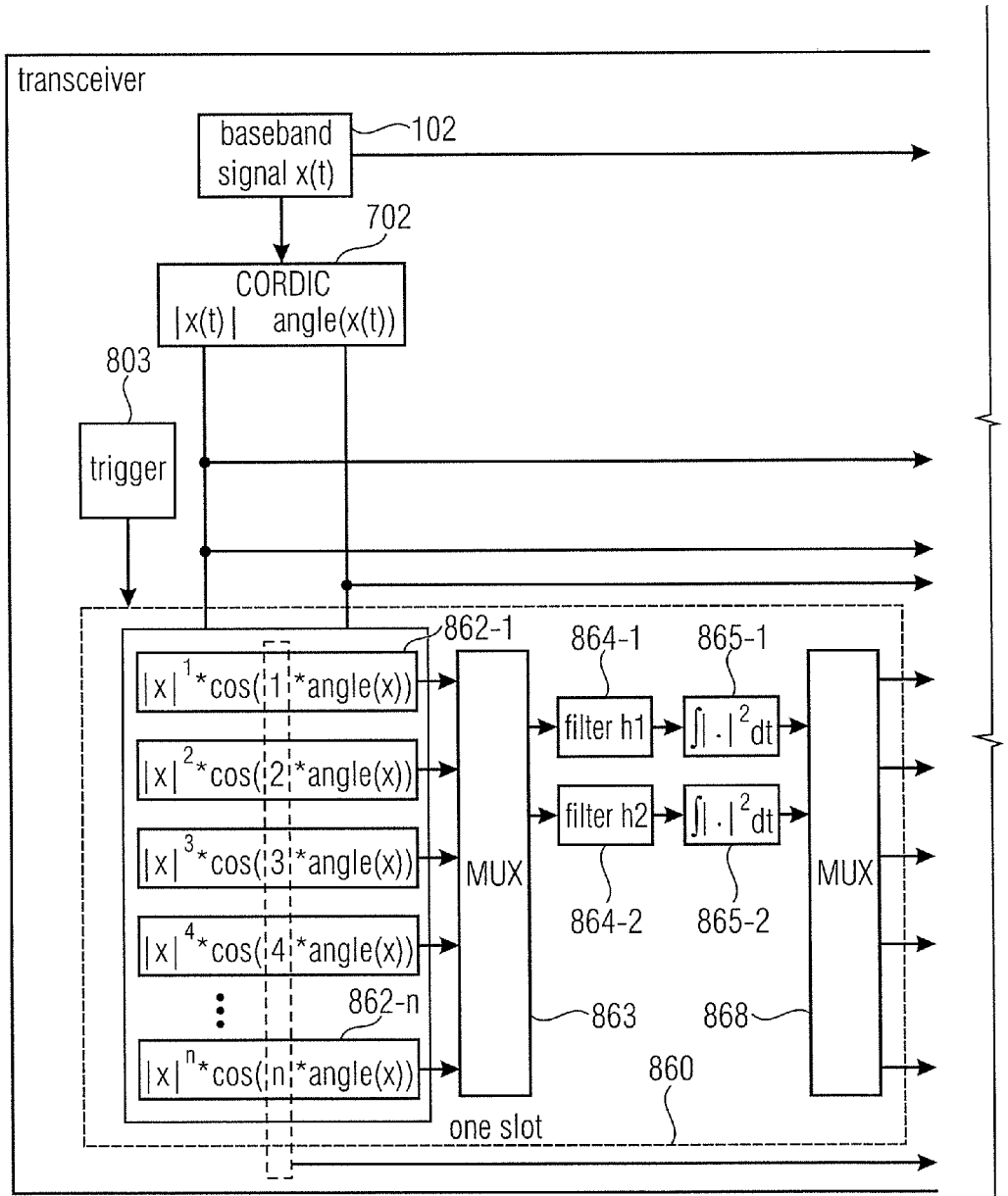
FIG. 14A-14B show a schematic block diagram of another implementation example of a distortion estimation apparatus according to embodiments.
Figure 14B:
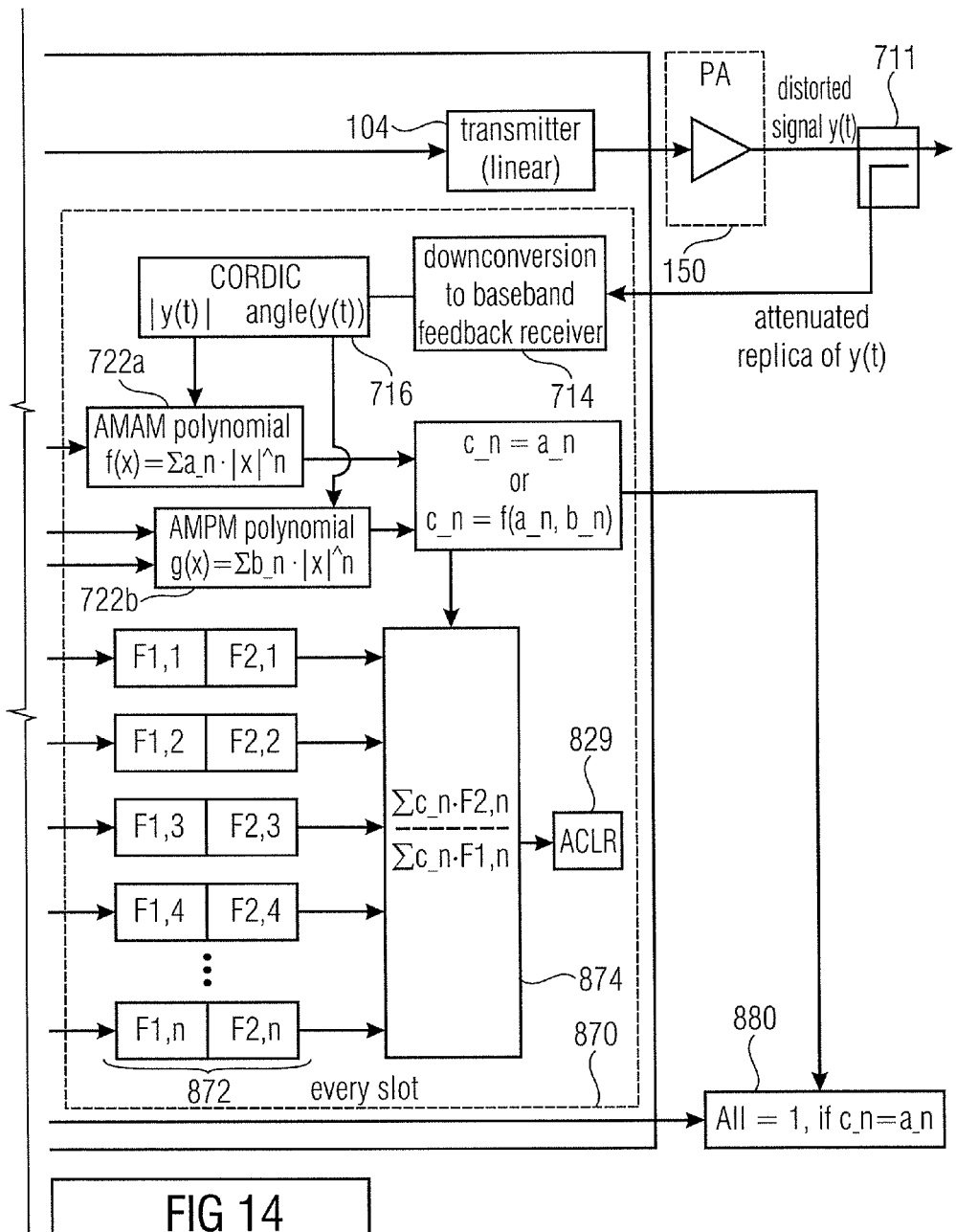

One important distortion parameter is the measure of ACLR (Adjacent Channel Leakage Ratio). This measure describes how much adjacent power leaks from the wanted channel into the adjacent/neighbor channel. The general definition is illustrated in FIG. 10. Two implementation examples for measuring the ACLR in a transceiver chip or a transceiver chip are shown in FIG. 11 and FIG. 14.

FIG. 10 schematically illustrates a general definition of the ACLR. In terms of formulae, the definition of the ACLR may be expressed as $$ACLR = \frac{\int |Y(f) \cdot H_1(f)|^2 df}{\int |Y(f) \cdot H_2(f)|^2 df}$$

where:
H1 represents a low pass (root raised cosine)
H2 represents a low pass (root raised cosine), shifted by $2*f_1$ In both cases schematically illustrated in FIGS. 11 and 14, the PA nonlinearity is measured by comparison of the input signal's amplitude and phase with the amplitude and phase of the demodulated signal from the output of the PA. The results are stored as coefficients of an AMAM and AMPM polynomial of degree n.

Figure 11:
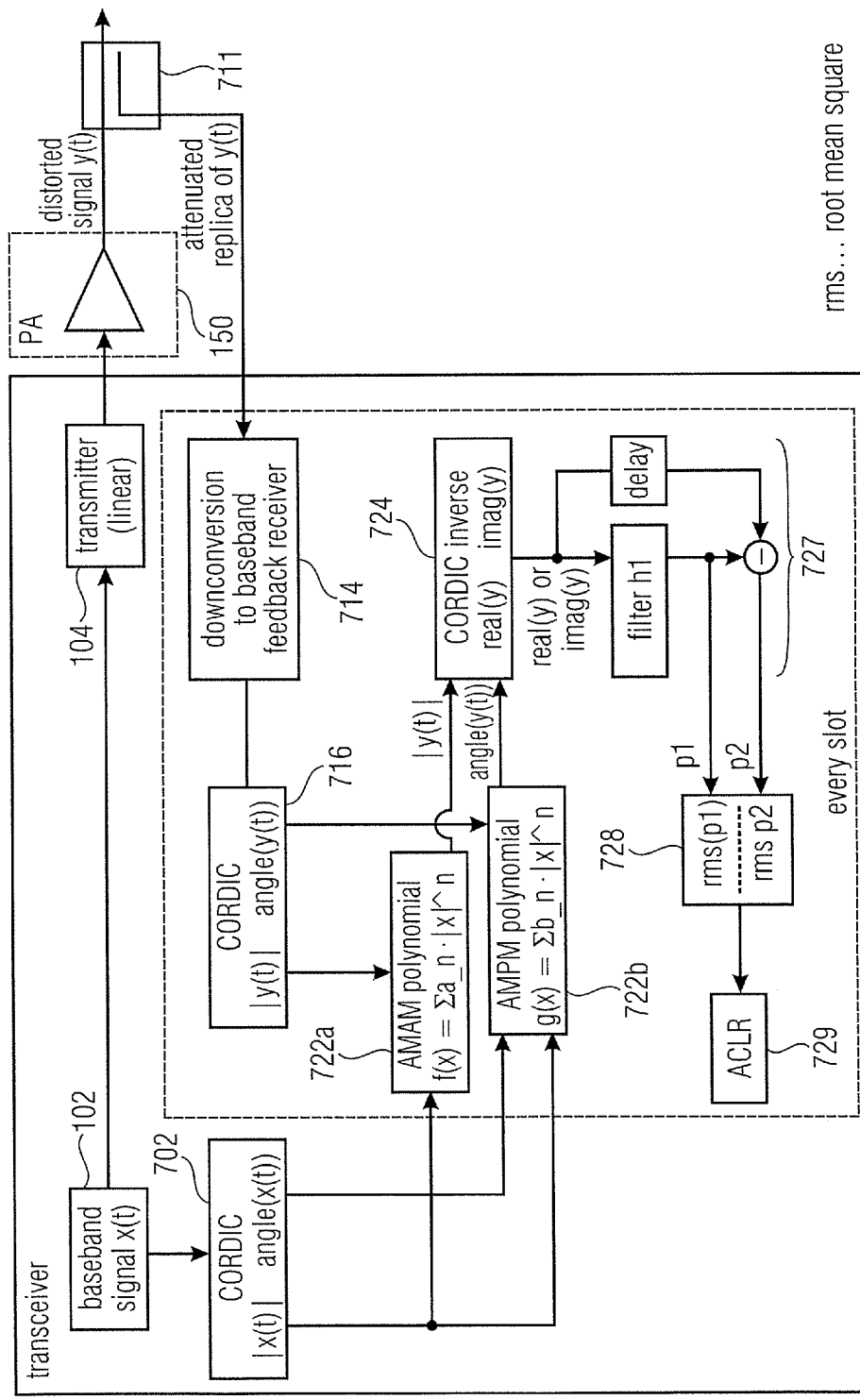
FIG. 11 shows a schematic block diagram of an implementation example of a distortion estimation apparatus according to embodiments.

The distortion estimation apparatus shown in FIG. 11 comprises an input signal processor 702, a coupler 711, a downconverter 714, a polar coordinate determiner 716, an AMAM distortion component 722a, an AMPM distortion component 722b, a vector coordinate determiner 724, a frequency splitter 727, a distortion parameter calculation 728, and a storage component 729. The input signal processor 702 comprises a polar coordinate determiner. Both, the polar coordinate determiner 724 and the input signal processor 702 employ a CORDIC (COordinate Rotation Digital Computer) scheme in order to determine an amplitude and a phase of the downconverted attenuated replica of the distorted output signal y(t) and the input signal, respectively. The AMAM distortion component 722a and the AMPM distortion component 722b constitute parts of the nonlinearity determiner and the distortion simulator. The AMAM distortion component 722a and the AMPM distortion component 722b provide a simulated distorted amplitude component |y(t)| of the input signal and a simulated distorted angle component ∠(y(t)) of the input signal. The distortion components 722a, 722b may be realized as polynomials, as lookup tables, as spline interpolation, or by another representation.

In the example shown in FIG. 11 the real or imaginary part of the distorted signal is filtered around the channel and the rms value (Root Mean Square value) and is calculated. Filtering is performed by means of a filter h1 which is part of the frequency splitter 727. The energy in the neighbor channel is obtained without filtering, by subtraction of the whole signal from the already filtered signal (see FIG. 11) and calculation of the rms. The element 727 (i.e. the filter h1 and the delay) may be more generally any lowpass, highpass, or bandpass structure. Alternatively to what is shown in FIG. 11, the amplitude or energy in the neighbor channel may also be obtained by means of a filter. For example, two polyphase filters may be combined to give the desired highpass characteristics, lowpass characteristics, or two bandpass characteristics. The division of the rms (by means of the distortion parameter calculation 728) values finally gives a number, which is proportional to the ACLR.

Figure 12:
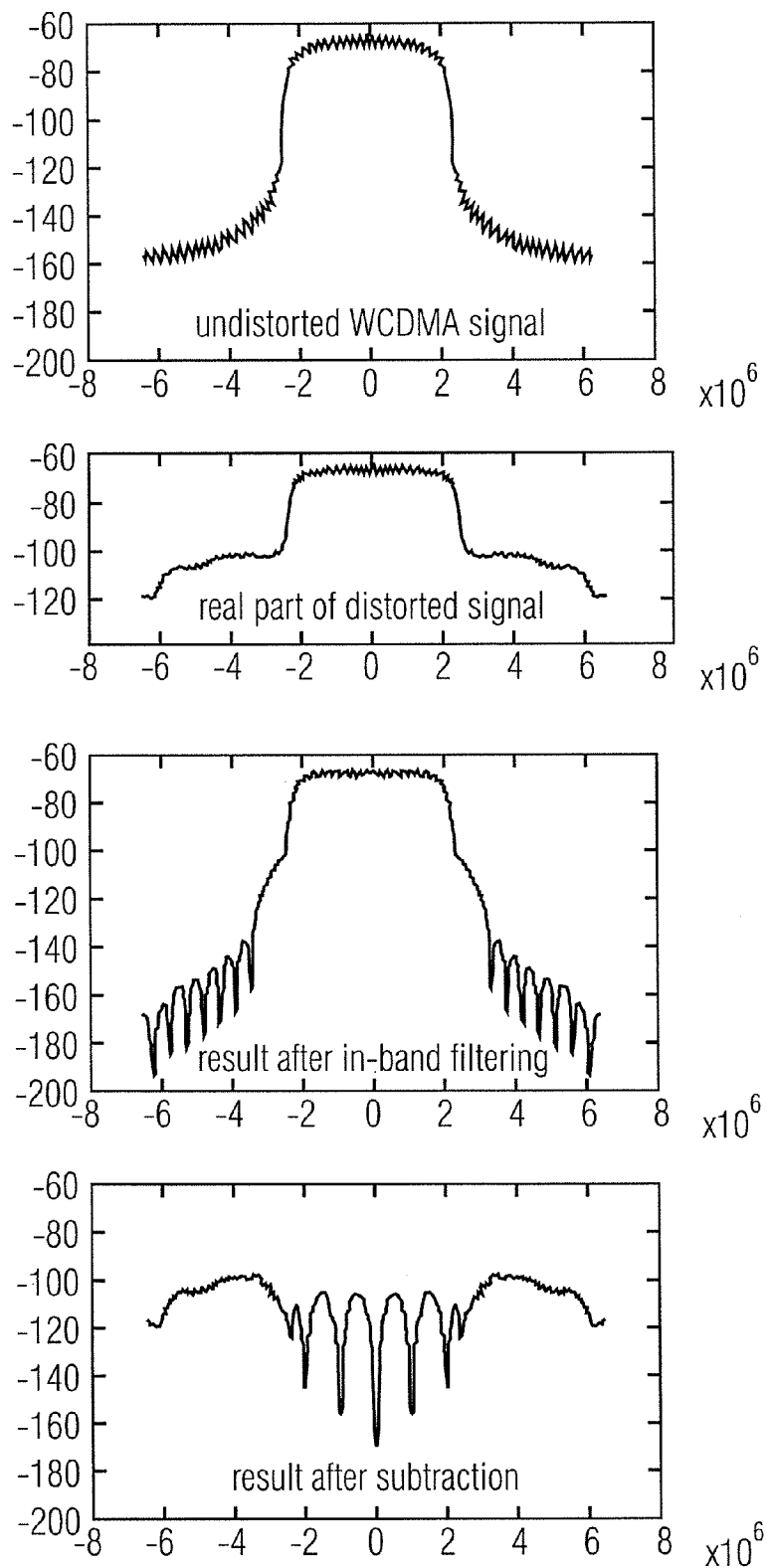
FIG. 12 schematically illustrates frequency power spectra of four different signals occurring within the distortion estimation apparatus shown in FIG. 11.

FIG. 12 schematically illustrates frequency power spectra of four different signals occurring within the distortion estimation apparatus shown in FIG. 11. The units of the ordinate are dB, the units of the abscissa are Hz. The undistorted WCDMA signal in the upper diagram corresponds to the input signal x(t). It can be seen that the signal-to-noise ratio is about 70 dB and that the bandwidth is approximately 4 MHz. The second diagram shows the frequency power spectrum of the real part of the distorted signal y(t). It can be seen that the signal-to-noise ratio is reduced to approximately 40 dB. The third diagram illustrates the frequency power spectrum of the filtered signal provided by the filter h1 of the frequency splitter 727. The fourth diagram illustrates the frequency power spectrum of the out-of-band signal after the subtractor of the frequency splitter 727. What can be seen is that due to the filtering process the in-band energy and out-of-band energy of the real part of the distorted signal can be separated. A simple RMS (Root mean square) calculation can be performed on each of the separated signals to obtain the overall in-band power and out-of-band power. Subsequently, these results are divided in 728 to obtain a figure of merit, which is proportional to the ACLR 729.

FIG. 13 illustrates a simulation result of an ACLR measurement performed using the distortion estimation apparatus shown in FIG. 11. The ACLR of the distorted signal y(t) at the output of the power amplifier (distorting element) 150 is represented as a function of a figure of merit (FOM) which is proportional to the ACLR and measured within the transceiver. FIG. 13 shows a linear dependence between the real ACLR at the output of the PA 150 and the estimated FOM in the chip for different nonlinearities of the PA, due to changing e.g. biasing, temp, VSWR, modulation test cases. Hence, it is sufficient to calculate the FOM in the chip and directly derive the ACLR from this dependence.

In the example schematically illustrated in FIG. 14 some parameters of the input signal are calculated and stored, if a trigger event 803 occurs. For that calculation the magnitude and phase of the input signal are combined to n new signals, as shown in the formulas 862-1 ... 862-n. A multiplexer 863 is feeding two filters 864-1 and 864-2 with each of the signals. The filters are the channel filters for the ACLR calculation, hence a low-pass h1 and a high-pass filter h2 or two band-pass root raised cosine filters, where one is shifted by the channel bandwidth of the signal (was already explained above). After the filters the signal power is calculated by the elements 865-1 and 865-2. Hence, the input signals 862 are reduced to simple characteristic numbers Fx,y which represent the in-band power and the out-of-band power. With a second multiplexer 868, these numbers are stored in a kind of matrix Fx,y 872. The index x corresponds to the number of the signal, and the index y corresponds to the index of the filter. In 874 the result is used together with the polynomials to calculate the ACLR 829. This can be done, independently of the trigger. The condition in 880 states, that the signal generation 862 is simplified, if there is only AMAM distortion, which means b_n=0 in 722*b*. The overall benefit of this implementation is that the block 860 is only executed, if a trigger event occurs. The time for filtering, which consumes a lot of current, is therefore reduced in a typical use case. The ACLR calculation itself is then based only on a few multiplications and additions.

Figure 15A:
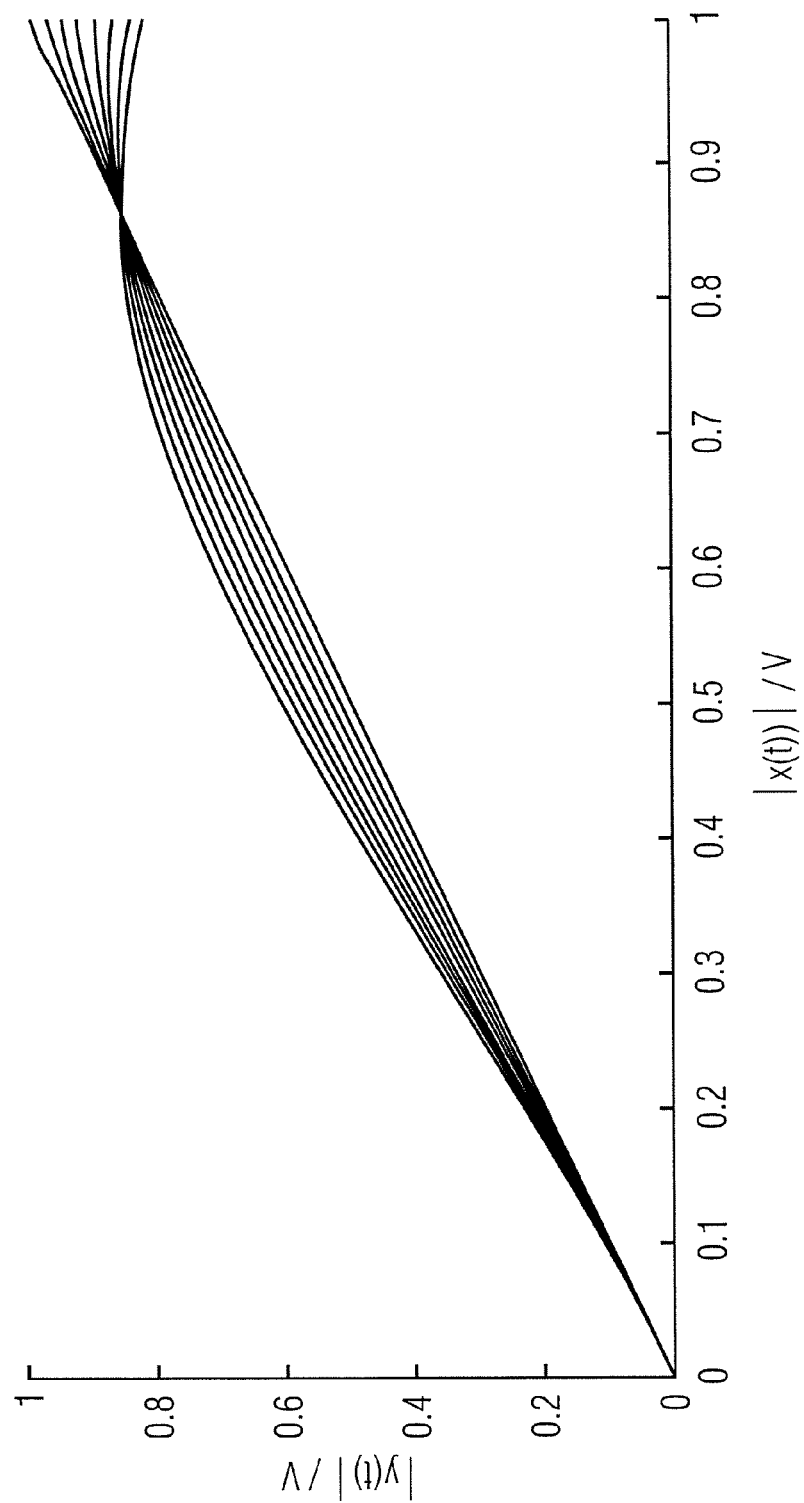
FIGS. 15A and 15B schematically illustrate various non-linearities of a particular distorting element.
Figure 15B:
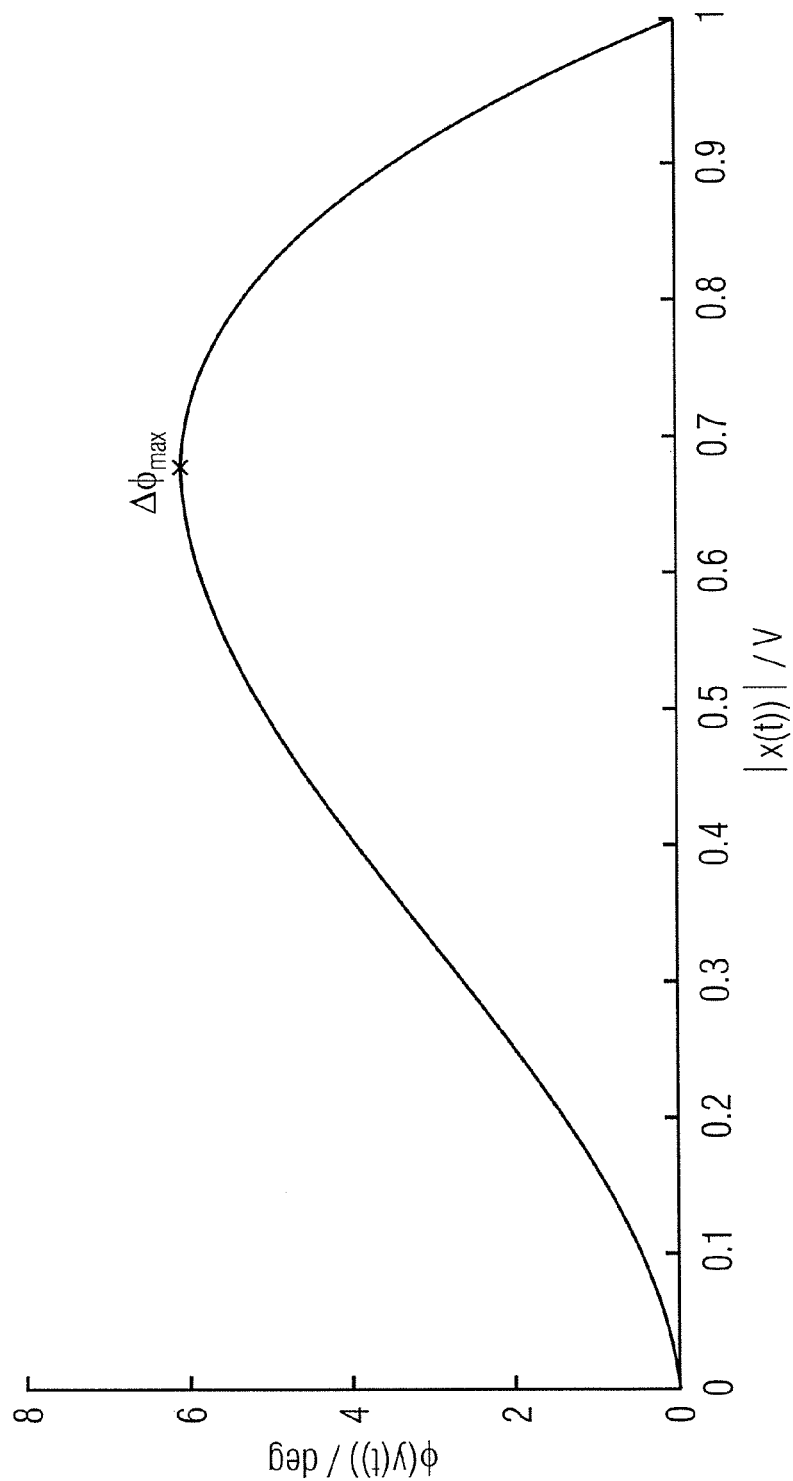

FIGS. 15A and 15B schematically illustrate different nonlinearities with which the distortion estimation apparatus of FIG. 14 was tested. FIG. 15A schematically illustrates different AMAM nonlinearities. FIG. 15B schematically illustrates an AMPM nonlinearity. The AMPM nonlinearity of FIG. 15B may appear alone or in combination with any one of the AMAM nonlinearities shown in FIG. 15A. Likewise, any one of the nonlinearities shown in FIG. 15A may appear in combination with the AMPM nonlinearity of FIG. 15B or without an AMPM nonlinearity.

FIG. 15C schematically illustrates the ACLR measured or determined at the output of the power amplifier (distorting element) as a function of the figure of merit FOM being a proportional number to the ACLR, measured in the transceiver. The different tested nonlinearities are represented by different symbols. It can be seen that for all tested nonlinearities the linear dependency between the figure of merit FOM and the ACLR is maintained.

Figure 16:
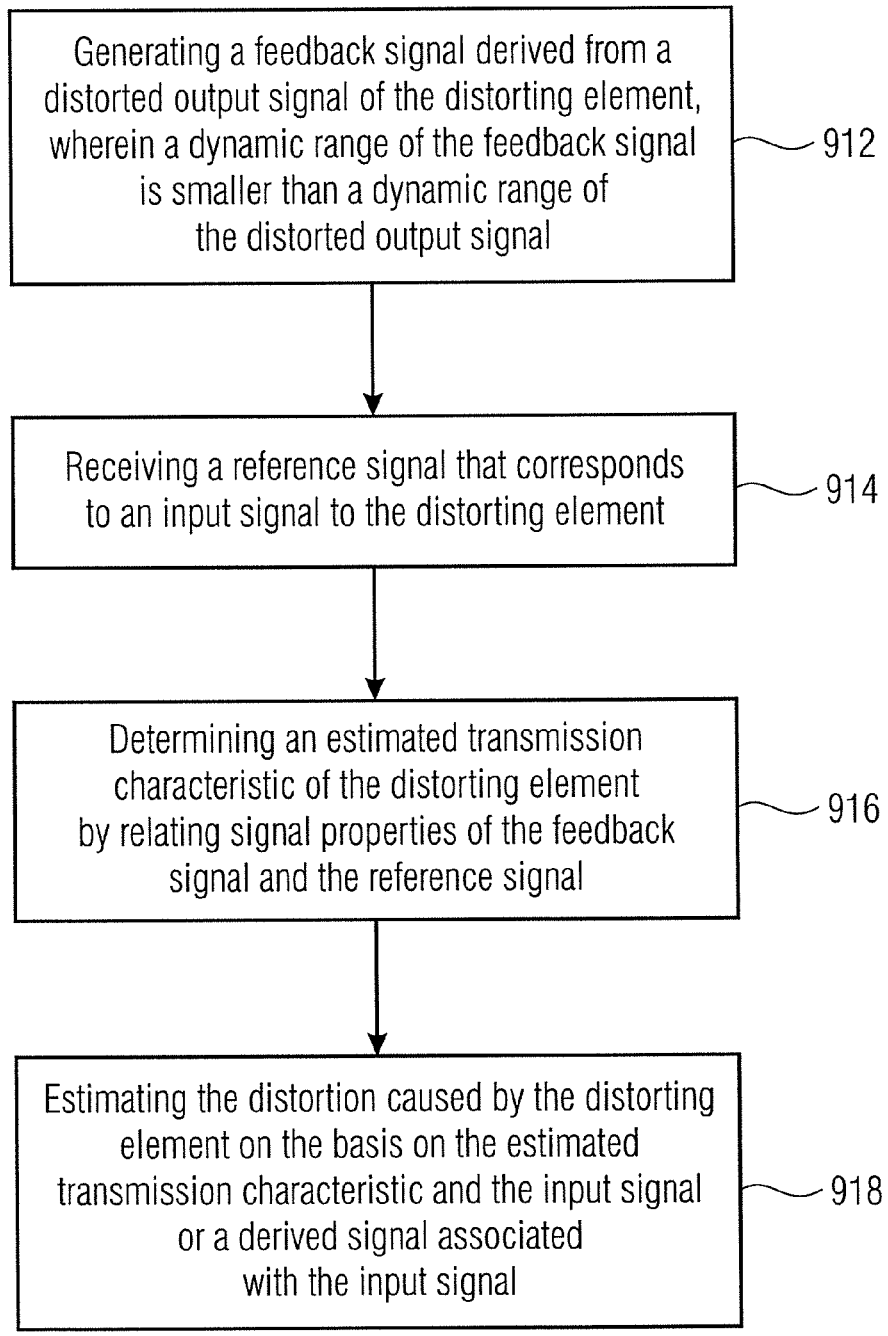
FIG. 16 shows a schematic flow diagram of a method for estimating a distortion.

FIG. 16 shows a schematic flow diagram of a method for estimating a distortion caused by a distorting element according to embodiments. According to a step 912 a feedback signal is generated. The feedback signal is derived from a distorted output signal of the distorting element. A signal property (e.g., dynamic range) of the feedback signal is smaller than a signal property (e.g., dynamic range) of the distorted output signal so that requirements for processing the feedback signal are typically lower than processing requirements for the distorted output signal. This means that relatively simple elements or circuits may be used for the processing of the feedback signal. In particular, in combinations with architectures in which a feedback path is available having lower specifications than the forward signal path, e.g., transceiver architectures, that are already implemented or established and not subject to easy modification, the proposed method may open a possibility for determining the current distortion caused by the distorting element.

At a step 914 a reference signal is received. The reference signal corresponds to an input signal to the distorting element. In particular, the reference signal may also be substantially identical to the input signal. In the alternative, the reference signal may be obtained by signal processing the input signal in which case the reference signal may also be regarded as a derived signal (derived from the input signal to the distorting element).

An estimated transmission characteristic of the distorting element is then determined in the context of a step 916 of the method schematically illustrated in FIG. 16. The determination of the estimated transmission characteristic may be achieved by relating signal properties of the feedback signal and the reference signal. For example, the feedback signal may be compared with the reference signal. The mentioned signal properties may be the instantaneous amplitudes of the reference signal and the feedback signal, or the instantaneous phases of these two signals. Other examples for the signal properties are the crest factors of the reference signal and the feedback signal.

At a step 918 the distortion caused by the distorting element is determined based on the estimated transmission characteristic and the input signal or a signal derived from the input signal and/or associated with the input signal.

Figure 17:
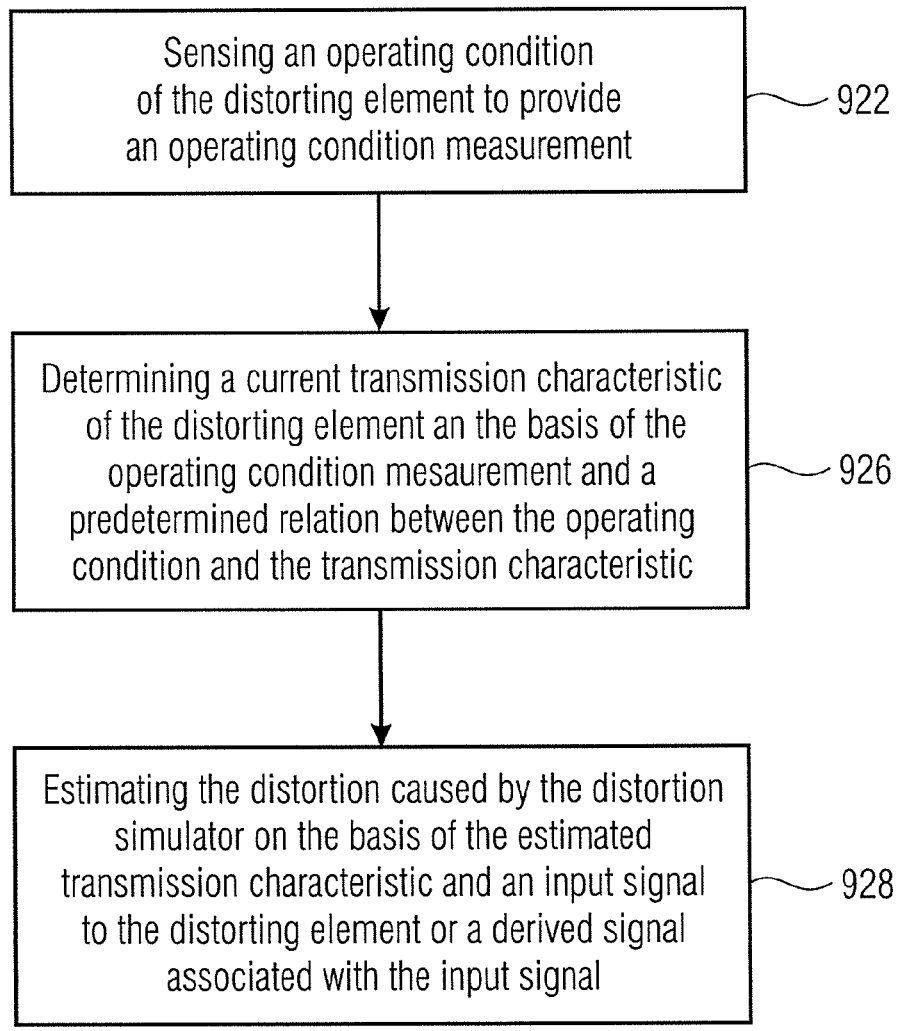
FIG. 17 shows a schematic flow diagram of a method for estimating a distortion.

FIG. 17 shows a schematic flow diagram of a method for estimating a distortion of a distorting element according to embodiments. The method comprises a step 922 of sensing an operating condition of the distorting element to provide an operating condition measurement. Note that the operating condition may also refer to an environmental condition such as a current temperature of the distorting element that influences the nonlinear behavior of the distorting element.

At a step 926 a current transmission characteristic of the distorting element is determined based on the operating condition measurement and a predetermined relation between the operating condition and the transmission characteristic.

The distortion caused by the distorting element is estimated during a step 928 based on the estimated transmission characteristic and an input signal to the distorting element or a derived signal associated with the input signal.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The invention claimed is:

1. A distortion estimation apparatus for estimating a distortion caused by a distorting element, the distortion estimation apparatus comprising:
   a feedback element configured to provide a feedback signal derived from a distorted output signal of the distorting element, wherein a signal processing quality of the feedback element is lower than an associated signal property of the distorted output signal;
   a nonlinearity determiner configured to receive the feedback signal and an input signal to the distorting element or a signal derived from the input signal, the nonlinearity determiner being configured to determine an estimated transmission characteristic of the distorting element by relating signal properties of the feedback signal and the input signal or the signal derived from the input signal; and
   a distortion simulator configured to estimate the distortion caused by the distorting element based on the input signal or the signal derived from the input signal and the estimated transmission characteristic.

2. The distortion estimation apparatus according to claim 1, wherein the feedback element is further configured to tap the distorted output signal of the distorting element and wherein the feedback signal is a quality-reduced representation of the distorted output signal.

3. The distortion estimation apparatus according to claim 1, wherein the feedback element comprises a frequency converter configured to frequency-convert the feedback signal from a first frequency range to a second frequency range.

4. The distortion estimation apparatus according to claim 1, wherein the feedback element comprises a signal analyzer configured to determine at least one output signal parameter of the distorted output signal, the at least one output signal parameter forming the feedback signal.

5. The distortion estimation apparatus according to claim 1, wherein the estimated transmission characteristic approximates an actual transmission characteristic of the distorting element for a first range of input powers or amplitudes to the distorting element, and wherein a second range of input powers or amplitudes is approximated as a linear transmission characteristic, wherein the second range comprises lower input powers or amplitudes than the first range of input powers or amplitudes.

6. The distortion estimation apparatus according to claim 1, further comprising a sensor configured to sense an operating condition of the distorting element to provide an operating condition measurement, wherein the nonlinearity determiner is further configured to determine an influence of the operating condition measurement on the estimated transmission characteristic, and to take the influence into account when determining the estimated transmission characteristic.

7. The distortion estimation apparatus according to claim 1, wherein the distortion simulator is further configured to determine a simulated distorted output signal based on the input signal or the derived signal and the estimated transmission characteristic, and estimate the distortion caused by the distorting element based on the simulated distorted output signal.

8. The distortion estimation apparatus according to claim 7, wherein the distortion simulator is further configured to measure a signal parameter of the simulated distorted output signal, and determine the distortion caused by the distorting element based on a predetermined dependency between the signal parameter and the distortion.

9. The distortion estimation apparatus according to claim 7, wherein the distortion simulator comprises:
  a first filter configured to determine an in-band signal component of the simulated distorted output signal;
  a second filter configured to determine an out-of-band signal component of the simulated distorted output signal; and
  an out-of-band distortion determiner configured to determine an out-of-band distortion caused by the distorting element based on the determined in-band signal component and the determined out-of-band signal component.

10. The distortion estimation apparatus according to claim 9, wherein the second filter comprises a signal subtraction element configured to subtract the in-band signal component from the simulated distorted output signal to determine an out-of-band signal component of the simulated distorted output signal.

11. The distortion estimation apparatus according to claim 1, wherein the distortion simulator is further configured to determine at least one signal parameter of the input signal, and determine the distortion caused by the distorting element based on a predetermined dependency between the at least one signal parameter of the input signal, the estimated transmission characteristic, and the distortion.

12. The distortion estimation apparatus according to claim 11, wherein the distortion simulator is configured to determine the signal parameter in response to an occurrence of a trigger event, to store the at least one signal parameter until a subsequent trigger event, and to use the at least one stored signal parameter for a subsequent determination of the distortion.

13. The distortion estimation apparatus according to claim 1, wherein the nonlinearity determiner comprises an input amplitude determiner, a feedback amplitude determiner, and an amplitude distortion storage configured to store amplitude distortion information obtained from relating determined feedback amplitude values to associated determined input amplitude values.

14. A distortion estimation apparatus configured to estimate a distortion of a distorting element, the distortion estimation apparatus comprising:
  a sensor configured to sense an operating condition of the distorting element to provide an operating condition measurement;
  a transmission characteristic determiner configured to determine a current transmission characteristic of the distorting element based on the operating condition measurement and a predetermined relation between the operating condition and the current transmission characteristic; and
  a distortion simulator configured to estimate the distortion caused by the distorting element based on the current transmission characteristic and an input signal to the distorting element or a signal derived from the input signal.

15. The distortion estimation apparatus according to claim 14, wherein the distortion simulator is further configured to determine a simulated distorted output signal based on the input signal or the signal from the input signal and the current transmission characteristic, and estimate the distortion caused by the distorting element based on the simulated distorted output signal.

16. The distortion estimation apparatus according to claim 15, wherein the distortion simulator is further configured to measure a signal parameter of the simulated distorted output signal, and determine the distortion caused by the distorting element based on a predetermined dependency between the signal parameter and the distortion.

17. The distortion estimation apparatus according to claim 15, wherein the distortion simulator comprises:
  a first filter configured to determine an in-band signal component of the simulated distorted output signal;
  a second filter configured to determine an out-of-band signal component of the simulated distorted output signal;
    an out-of-band distortion determiner configured to determine an out-of-band distortion caused by the distorting element based on the determined in-band signal component and the determined out-of-band signal component.

18. The distortion estimation apparatus according to claim 17, wherein the second filter comprises a signal subtraction element configured to subtract the in-band signal component from the simulated distorted output signal to determine an out-of-band signal component of the simulated distorted output signal.

19. The distortion estimation apparatus according to claim 14, wherein the distortion simulator is further configured to determine at least one signal parameter of the input signal, and determine the distortion caused by the distorting element based on a predetermined dependency between the at least one signal parameter of the input signal, the current transmission characteristic, and the distortion.

20. The distortion estimation apparatus according to claim 19, wherein the distortion simulator is configured to determine the signal parameter in response to an occurrence of a trigger event, to store the at least one signal parameter until a subsequent trigger event, and to use the at least one stored signal parameter for a subsequent determination of the distortion.

* * * * *